(12) United States Patent
Salasky et al.

(10) Patent No.: US 9,927,531 B2
(45) Date of Patent: Mar. 27, 2018

(54) VARIABLE METAL MULTI-GATE METAL OXIDE SEMICONDUCTOR CAPACITOR RADIATION SENSOR FOR IMPROVED GAIN AND TISSUE EQUIVALENCE

(71) Applicants: LANDAUER, INC., Glenwood, IL (US); PURDUE RESEARCH FOUNDATION, West Lafayette, IN (US)

(72) Inventors: Mark Raymond Salasky, St. John, IN (US); Sean M. Scott, West Lafayette, IN (US); P. Alexander Walerow, Momence, IL (US); Daniel John Valentino, Naperville, IL (US); Dimitrios Peroulis, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 14/870,298

(22) Filed: Sep. 30, 2015

(65) Prior Publication Data

US 2016/0187493 A1    Jun. 30, 2016

Related U.S. Application Data

(60) Provisional application No. 62/065,087, filed on Oct. 17, 2014.

(51) Int. Cl.
*H01L 31/119* (2006.01)
*G01T 1/02* (2006.01)
(Continued)

(52) U.S. Cl.
CPC ............... *G01T 1/026* (2013.01); *G01T 7/00* (2013.01); *G01T 7/005* (2013.01);
(Continued)

(58) Field of Classification Search
CPC ........ H01L 31/115; H01L 28/40; G01T 1/026
See application file for complete search history.

(56) References Cited

U.S. PATENT DOCUMENTS 4,484,076 A    11/1984  Thomson
4,658,281 A *  4/1987  Sevenhans ........ H01L 27/14887
                                                   257/230
(Continued)

FOREIGN PATENT DOCUMENTS

EP         2381273 A2    10/2011

OTHER PUBLICATIONS

International Search Report and Written Opinion dated Jan. 27, 2016 in corresponding International Application No. PCT/IB2015/057533.
International Search Report and Written Opinion dated Jan. 27, 2016 in corresponding International Application No. PCT/IB2015/057534.

*Primary Examiner* — David Porta
*Assistant Examiner* — Faye Boosalis
(74) *Attorney, Agent, or Firm* — Harness, Dickey & Pierce, P.L.C.

(57) ABSTRACT

A method and apparatus is disclosed for differentially altering the radiation response across multiple MOSCAP sensors by placing different thin gate materials with different atomic numbers on a series of MOS-based radiation sensors. The secondary electrons created in high-atomic weight materials (such as gold) at lower incident photon energy levels enable a tissue equivalent radiation response and radiations source identification/differentiation. This is a desirable alternative to using filters with different coefficients across a series of MOSCAP radiation sensor which will attenuate the signal and degrade the device form factor. The method and apparatus disclosed achieves the same functionality but with inherent gain instead of attenuation, thus increasing sensitivity. This will improve the minimum resolvable dose for (Continued)

x-rays and low-energy gammas (high-energy gammas will remain the same), and produces a response that can distinguish the energy level of incident radiation photon.

21 Claims, 29 Drawing Sheets

(51) Int. Cl.
    *H01L 31/18*     (2006.01)
    *G01T 7/00*     (2006.01)
    *H01L 27/144*     (2006.01)

(52) U.S. Cl.
    CPC ........ *H01L 27/1443* (2013.01); *H01L 31/119* (2013.01); *H01L 31/1804* (2013.01)

(56) References Cited

U.S. PATENT DOCUMENTS

| | | |
|---|---|---|
| 7,939,873 B2* | 5/2011 | Honda .................... H01L 29/94 |
| | | 257/300 |
| 8,803,089 B2 | 8/2014 | Walerow et al. |
| 9,057,786 B2 | 6/2015 | Walerow et al. |
| 9,063,235 B2 | 6/2015 | Walerow et al. |
| 9,614,098 B2* | 4/2017 | Zhao .................... H01L 29/7869 |
| 2005/0099188 A1 | 5/2005 | Baxter |
| 2010/0164534 A1 | 7/2010 | Rozenfeld |
| 2010/0219494 A1 | 9/2010 | Barnaby |
| 2011/0121980 A1 | 5/2011 | Doughty et al. |
| 2011/0215227 A1* | 9/2011 | Yan .................... H01L 31/1136 |
| | | 250/214 A |
| 2013/0048869 A1 | 2/2013 | Kominami et al. |
| 2014/0299783 A1 | 10/2014 | Valentino et al. |

* cited by examiner

Table 1

| Z-Value | Elements | Al | Si | Ti | V | Cr | Fe | Ni | Cu | Zn | Zr | Mo | Rh | Pd | Ag | Sb | Hf | Ta | W | Re | Pt | Au |
|---|---|---|---|---|---|---|---|---|---|---|---|---|---|---|---|---|---|---|---|---|---|---|
| | | 13 | 14 | 22 | 23 | 24 | 26 | 28 | 29 | 30 | 40 | 42 | 45 | 46 | 47 | 51 | 72 | 73 | 74 | 75 | 78 | 79 |

Low-Z: Al–Zn; Mid-Z: Ti–Rh; High-Z: Zr–Au

Fig. 29

VARIABLE METAL MULTI-GATE METAL OXIDE SEMICONDUCTOR CAPACITOR RADIATION SENSOR FOR IMPROVED GAIN AND TISSUE EQUIVALENCE

CROSS-REFERENCE TO RELATED APPLICATIONS

This application claims benefit of priority to U.S. Provisional Patent Application No. 62/065,087 to Valentino, et al., entitled, "MOS CAPACITOR-BASED, ACCUMULATING, RADIATION-SENSITIVE DETECTOR FOR OCCUPATIONAL, ENVIRONMENTAL AND MEDICAL DOSIMETRY," filed Oct. 17, 2014 which is incorporated herein by reference in its entirety.

BACKGROUND

Field of the Invention

The present invention relates to radiation dosimetry and more specifically to high sensitivity radiation dose semiconductor sensors for occupational dosimetry.

Related Art

The United States, as well as many other countries, requires employees who work with sources of ionizing radiation to be monitored by a federally-accredited program. Occupation dosimetry, as it is called, covers millions of radiation workers in healthcare, mining, the nuclear power industry, etc., and monitors the long-term exposure to potentially-harmful doses of ionizing radiation. Typical applied doses range from 0.1 mSv to 50 mSv (or 0.01 Rem to 5 Rem). The maximum whole-body dose allowed in the United States is 50 mSv per year. This needs to be measured above the background radiation (average of about 3 mSv per year) that the user receives to determine what dose received was occupational.

Capacitive radiation sensors, in particular semiconductor-based capacitive radiation sensors, such as radiation sensitive MOSCAP sensors offer high sensitivity and measurement resolution and are therefore relevant in radiation dosimetry application. In occupational dosimetry, an effort needs to be made to ensure that the sensor responds or receives radiation in the same way as human tissue. One demonstrated way is by placing filters over a series of sensors to attenuate signal at different energy levels, and use a weighted sum of the outputs to approximate tissue equivalence of the sensor radiation response. As a consequence the performance of the sensor may suffer as these filters, limit the measurement sensitivity of incident radiation by variably attenuating the radiation signal based on incident photon energy. Additionally, the filters that would otherwise be used to obtain tissue equivalence are large and prevent miniaturization of circuitry while making measurement more complicated.

SUMMARY

The foregoing needs are met, to a great extent, by the present invention wherein, according to a first broad aspect, the present invention provides a method comprising differentially enhancing a plurality of radiation-induced signals in one or more metal oxide semiconductor capacitors (MOSCAPs) having a plurality of radiation-sensitive gate terminals, wherein a radiation sensitivity of a gate terminal depends on a gate composition material of the gate terminal and an energy of an incident radiation on the one or more MOSCAPs.

According to a second broad aspect, the present invention provides an apparatus comprising one or more metal oxide semiconductor capacitors (MOSCAPs) having three or more gate terminals disposed over a radiations-sensitive dielectric layer, wherein at least three respective gate terminals of the three or more gate terminals are each comprised of a respective different respective gate composition material, wherein each respective different gate composition material has a different respective level of radiation sensitivity, wherein each different respective level of radiation sensitivity depends on a respective atomic number for a gate composition material and an energy level of an incident radiation.

According to a third broad aspect, the present invention provides a method comprising of measuring three or more radiation-induced signals from three or more gate terminals in one or more metal oxide semiconductor capacitor (MOSCAP) sensors. The method may also include determining a tissue equivalent radiation response based on the three or more radiation-induced signals in the one or more MOSCAP sensors, wherein the three or more gate terminals are each comprised of a respective different gate composition material having a different respective radiation sensitivity.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

FIG. 29 is a table (referenced as Table 1 in the specification) of different gate composition materials.

DETAILED DESCRIPTION OF THE PREFERRED EMBODIMENTS

Definitions

Figure 1:
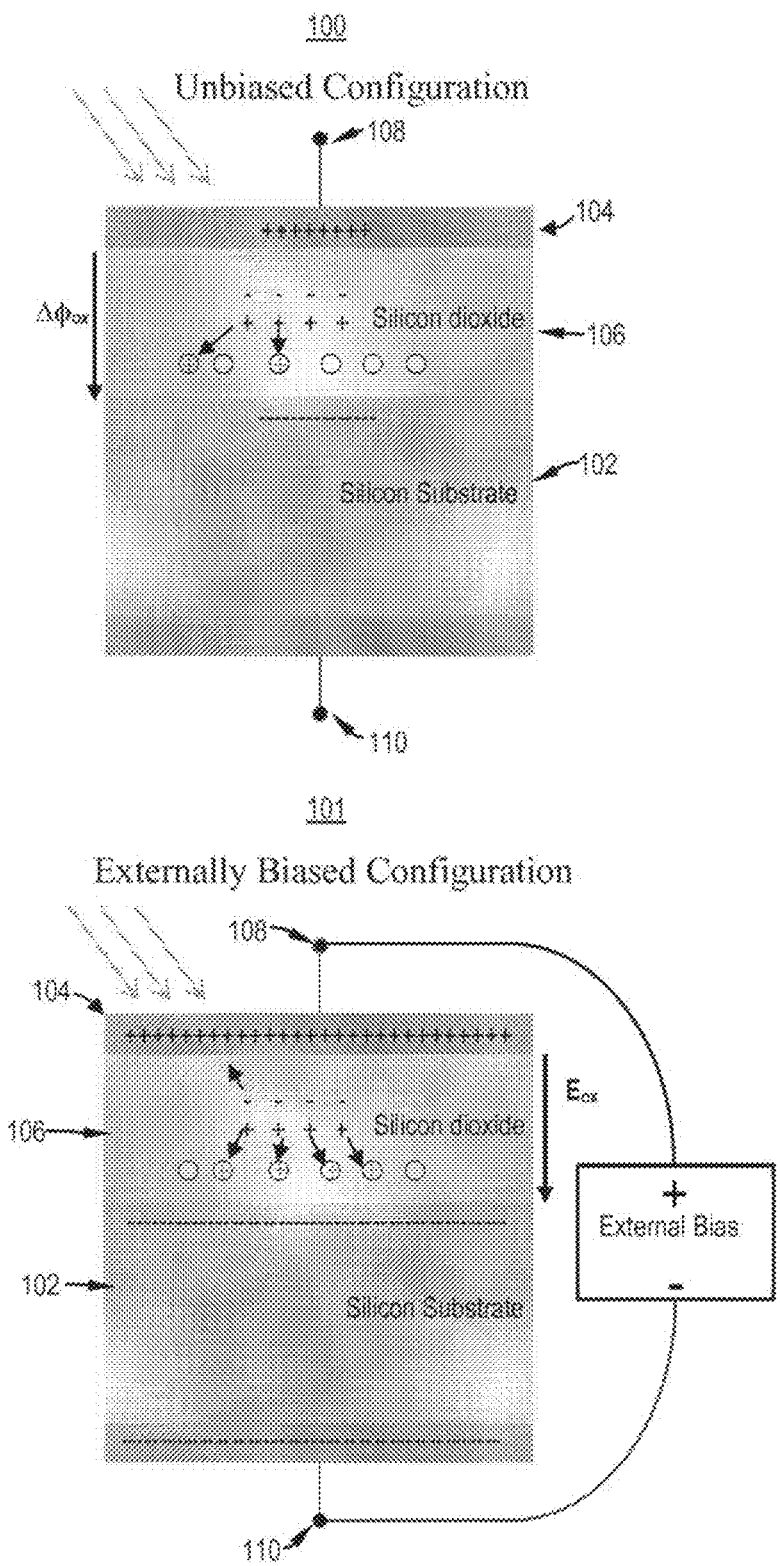
FIG. 1 illustrates a basic structure of a radiation-sensitive MOSCAP showing the electrostatic condition of the device in both an unbiased and externally biased state, according to one embodiment of the present invention.

Where the definition of terms departs from the commonly used meaning of the term, applicant intends to utilize the definitions provided below, unless specifically indicated.

For purposes of the present invention, it should be noted that the singular forms, "a," "an" and "the," include reference to the plural unless the context as herein presented clearly indicates otherwise.

For purposes of the present invention, directional terms such as "top," "bottom," "upper," "lower," "above," "below," "left," "right," "horizontal," "vertical," "up," "down," etc., are used merely for convenience in describing the various embodiments of the present invention. The embodiments of the present invention may be oriented in various ways. For example, the diagrams, apparatuses, etc., shown in the drawing figures may be flipped over, rotated by 90° in any direction, reversed, etc.

For purposes of the present invention, a value or property is "based" on a particular value, property, the satisfaction of a condition or other factor if that value is derived by performing a mathematical calculation or logical operation using that value, property or other factor.

For purposes of the present invention, the term "associated" with respect to data refers to data that are associated or linked to each other. For example, data relating the identity of an individual (identity data) wearing an integrated sensor module may be associated with the motion data for the individual obtained from an accelerometer or, optionally, from a gyroscope or, optionally, from the amplitude of the power signal from an energy harvester.

For purposes of the present invention, the term "base station" refers to any device or system with one or more serial interfaces capable, for example, of 2.4 Ghz communication, including peripheral devices such as workstations, laptops, tablet computers, desktop computers, etc.

For purposes of the present invention, the term "Bluetooth®" refers to a wireless technology standard for exchanging data over short distances (using short-wavelength radio transmissions in the ISM band from 2400-2480 MHz) from fixed and mobile devices, creating personal area networks (PANs) with high levels of security. Created by telecom vendor Ericsson in 1994, it was originally conceived as a wireless alternative to RS-232 data cables. It can connect several devices, overcoming problems of synchronization. Bluetooth® is managed by the Bluetooth® Special Interest Group, which has more than 18,000 member companies in the areas of telecommunication, computing, networking, and consumer electronics. Bluetooth® was standardized as IEEE 802.15.1, but the standard is no longer maintained. The SIG oversees the development of the specification, manages the qualification program, and protects the trademarks. To be marketed as a Bluetooth® device, it must be qualified to standards defined by the SIG. A network of patents is required to implement the technology and is licensed only for those qualifying devices.

For purposes of the present invention, the term "capacitance response" refers to an alteration in the capacitance parameter.

For purposes of the present invention, the term "capacitance to digital converter" refers to an electronic component, circuit or system configured to produce a digital signal representation of a capacitance parameter.

For purposes of the present invention, the term "capacitance to digital converter" refers to an electronic component, circuit or system configured to produce a digital signal representation of a capacitance parameter.

For purposes of the present invention, the term "capacitive readout circuit" refers to an electronic component, circuit or system configured to electronically measure and represents the capacitance parameter in form of an electrical signal.

For purposes of the present invention, the term "capacitive readout circuit" refers to an electronic component, circuit or system configured to electronically measure and represents the capacitance parameter in form of an electrical signal.

For purposes of the present invention, the term "cloud computing" is synonymous with computing performed by computers that are located remotely and accessed via the Internet (the "Cloud"). It is a style of computing where the computing resources are provided "as a service", allowing users to access technology-enabled services "in the cloud" without knowledge of, expertise with, or control over the technology infrastructure that supports them. According to the IEEE Computer Society it "is a paradigm in which information is permanently stored in servers on the Internet and cached temporarily on clients that include desktops, entertainment centers, table computers, notebooks, wall computers, handhelds, etc." Cloud computing is a general concept that incorporates virtualized storage, computing and web services and, often, software as a service (SaaS), where the common theme is reliance on the Internet for satisfying the computing needs of the users. For example, Google Apps provides common business applications online that are accessed from a web browser, while the software and data are stored on the servers. Some successful cloud architectures may have little or no established infrastructure or billing systems whatsoever including Peer-to-peer networks like BitTorrent and Skype and volunteer computing like SETI@home. The majority of cloud computing infrastructure currently consists of reliable services delivered through next-generation data centers that are built on computer and storage virtualization technologies. The services may be accessible anywhere in the world, with the Cloud appearing as a single point of access for all the computing needs of data consumers. Commercial offerings may need to meet the quality of service requirements of customers and may offer service level agreements. Open standards and open source software are also critical to the growth of cloud computing. As customers generally do not own the infrastructure, they are merely accessing or renting, they may forego capital expenditure and consume resources as a service, paying instead for what they use. Many cloud computing offerings have adopted the utility computing model which is analogous to how traditional utilities like electricity are consumed, while others are billed on a subscription basis. By sharing "perishable and intangible" computing power between multiple tenants, utilization rates may be improved (as servers are not left idle) which can reduce costs significantly while increasing the speed of application development. A side effect of this approach is that "computer capacity rises dramatically" as customers may not have to engineer for peak loads. Adoption has been enabled by "increased high-speed bandwidth" which makes it possible to receive the same response times from centralized infrastructure at other sites.

For purposes of the present invention, the term "computer hardware" and the term "hardware" refer to the digital circuitry and physical devices of a computer system, as opposed to computer software, which is stored on a hardware device such as a hard disk. Most computer hardware is not seen by normal users, because it is embedded within a variety of every day systems, such as in automobiles, microwave ovens, electrocardiograph machines, compact disc players, and video games, among many others. A typical personal computer consists of a case or chassis in a tower shape (desktop) and the following parts: motherboard, CPU, RAM, firmware, internal buses (PIC, PCI-E, USB, HyperTransport, CSI, AGP, VLB), external bus controllers (parallel port, serial port, USB, Firewire, SCSI. PS/2, ISA, EISA, MCA), power supply, case control with cooling fan, storage controllers (CD-ROM, DVD, DVD-ROM, DVD Writer, DVD RAM Drive, Blu-ray, BD-ROM, BD Writer, floppy disk, USB Flash, tape drives, SATA, SAS), video controller, sound card, network controllers (modem, NIC), and peripherals, including mice, keyboards, pointing devices, gaming devices, scanner, webcam, audio devices, printers, monitors, etc.

For purposes of the present invention, the term "computer network" refers to a group of interconnected computers. Networks may be classified according to a wide variety of characteristics. The most common types of computer networks in order of scale include: Personal Area Network (PAN), Local Area Network (LAN), Campus Area Network (CAN), Metropolitan Area Network (MAN), Wide Area Network (WAN), Global Area Network (GAN), Internetwork (intranet, extranet, Internet), and various types of wireless networks. All networks are made up of basic hardware building blocks to interconnect network nodes, such as Network Interface Cards (NICs), Bridges, Hubs, Switches, and Routers. In addition, some method of connecting these building blocks is required, usually in the form of galvanic cable (most commonly category 5 cable). Less common are microwave links (as in IEEE 802.11) or optical cable ("optical fiber").

For purposes of the present invention, the term "computer software" and the term "software" refers to one or more computer programs, procedures and documentation that perform some tasks on a computer system. The term includes application software such as word processors which perform productive tasks for users, system software such as operating systems, which interface with hardware to provide the necessary services for application software, and middleware which controls and co-ordinates distributed systems. Software may include websites, programs, video games, etc. that are coded by programming languages like C, C++, Java, etc. Computer software is usually regarded as anything but hardware, meaning the "hard" are the parts that are tangible (able to hold) while the "soft" part is the intangible objects inside the computer. Computer software is so called to distinguish it from computer hardware, which encompasses the physical interconnections and devices required to store and execute (or run) the software. At the lowest level, software consists of a machine language specific to an individual processor. A machine language consists of groups of binary values signifying processor instructions which change the state of the computer from its preceding state.

For purposes of the present invention, the term "computer system" refers to any type of computer system that implements software including an individual computer such as a personal computer, mainframe computer, mini-computer, etc. In addition, computer system refers to any type of network of computers, such as a network of computers in a business, the Internet, personal data assistant (PDA), devices such as a cell phone, a television, a videogame console, a compressed audio or video player such as an MP3 player, a DVD player, a microwave oven, etc. A personal computer is one type of computer system that typically includes the following components: a case or chassis in a tower shape (desktop) and the following parts: motherboard, CPU, RAM, firmware, internal buses (PIC, PCI-E, USB, Hyper-Transport, CSI, AGP, VLB), external bus controllers (parallel port, serial port, USB, Firewire, SCSI. PS/2, ISA, EISA, MCA), power supply, case control with cooling fan, storage controllers (CD-ROM, DVD, DVD-ROM, DVD Writer, DVD RAM Drive, Blu-ray, BD-ROM, BD Writer, floppy disk, USB Flash, tape drives, SATA, SAS), video controller, sound card, network controllers (modem, NIC), and peripherals, including mice, keyboards, pointing devices, gaming devices, scanner, webcam, audio devices, printers, monitors, etc.

For purposes of the present invention, the term "computer" refers to any type of computer or other device that implements software including an individual computer such as a personal computer, laptop computer, tablet computer, mainframe computer, mini-computer, etc. A computer also refers to electronic devices such as an electronic scientific instrument such as a spectrometer, a smartphone, an eBook reader, a cell phone, a television, a handheld electronic game console, a videogame console, a compressed audio or video player such as an MP3 player, a Blu-ray player, a DVD player, etc. In addition, the term "computer" refers to any type of network of computers, such as a network of computers in a business, a computer bank, the Cloud, the Internet, etc. Various processes of the present invention may be carried out using a computer. Various functions of the present invention may be performed by one or more computers.

For purposes of the present invention, the term "coupled" refers to a condition of being directly or indirectly connected.

For purposes of the present invention, the term "coupled" refers to a condition of being directly or indirectly connected.

For purposes of the present invention, the term "data storage medium" or "data storage device" refers to any medium or media on which a data may be stored for use by a computer system. Examples of data storage media include floppy disks, Zip™ disks, CD-ROM, CD-R, CD-RW, DVD, DVD-R, memory sticks, flash memory, hard disks, solid state disks, optical disks, etc. Two or more data storage media acting similarly to a single data storage medium may be referred to as a "data storage medium" For purposes of the present invention. A data storage medium may be part of a computer.

For purposes of the present invention, the term "data" means the reinterpretable representation of information in a formalized manner suitable for communication, interpretation, or processing. Although one type of common type data is a computer file, data may also be streaming data, a web service, etc. The term "data" is used to refer to one or more pieces of data.

For purposes of the present invention, the term "database" or "data record" refers to a structured collection of records or data that is stored in a computer system. The structure is achieved by organizing the data according to a database model. The model in most common use today is the relational model. Other models such as the hierarchical model and the network model use a more explicit representation of relationships (see below for explanation of the various database models). A computer database relies upon software to organize the storage of data. This software is known as a database management system (DBMS). Database management systems are categorized according to the database model that they support. The model tends to determine the query languages that are available to access the database. A great deal of the internal engineering of a DBMS, however, is independent of the data model, and is concerned with managing factors such as performance, concurrency, integrity, and recovery from hardware failures. In these areas there are large differences between products.

For purposes of the present invention, the term "depletion operation regime," "depletion region of operation," "depletion operating region," "depletion region," "operate in depletion," "operating in depletion" or "depletion operation region" may be used interchangeably to refer to an operational mode, condition, state or phenomena and attributes or characteristics resulting therefrom, wherein an insulating region, from which the mobile charge carriers have diffused away or have been forced away by an electric field, is formed within a conductive, doped semiconductor material. The only elements left in the insulating region, also referred to as a "depletion region," are ionized donor or acceptor impurities. The depletion region is so named, because it is formed from a conducting doped semiconductor region by removal of all free charge carriers, leaving none to carry a current.

For purposes of the present invention, the term "differentially enhanced" refers to a process or condition wherein enhancement of a parameter or a particular response occurs at different degree for different instances of the parameter or response.

For purposes of the present invention, the term "electronically measurable" refers to a physical, chemical or optical quantity that may be accurately represented as an electrical parameter such as capacitance, resistance, current or voltage and hence detected and quantified with one or more electronic components, devices, circuits or systems.

For purposes of the present invention, the term "epitaxial layer" refers to a single crystal layer formed on top of a single crystal substrate in semiconductor fabrication. The crystallographic structure of the epitaxial layer reproduces structure of the substrate but its doping level and conductivity type may be controlled independently of the substrate.

For purposes of the present invention, the term "epitaxy" refers to a process by which thin layer of single-crystal material is deposited on single-crystal substrate. Epitaxial growth occurs in such way that the crystallographic structure of the substrate is reproduced in the growing material.

For purposes of the present invention, the term "hardware and/or software" refers to functions that may be performed by digital software, digital hardware, or a combination of both digital hardware and digital software. Various features of the present invention may be performed by hardware and/or software.

For purposes of the present invention, the term "incident radiation" refers to radiation that is incident upon an object or device, such as a sensor.

For purposes of the present invention, the term "individual" refers to an individual mammal, such as a human being.

For purposes of the present invention, the term "Internet protocol (IP)" refers to a protocol used for communicating data across a packet-switched internetwork using the Internet Protocol Suite (TCP/IP). IP is the primary protocol in the Internet Layer of the Internet Protocol Suite and has the task of delivering datagrams (packets) from the source host to the destination host solely based on its address. For this purpose the Internet Protocol defines addressing methods and structures for datagram encapsulation. The first major version of addressing structure, now referred to as Internet Protocol Version 4 (Ipv4) is still the dominant protocol of the Internet, although the successor, Internet Protocol Version 6 (Ipv6) is actively deployed world-wide. In one embodiment, an EGI-SOA of the present invention may be specifically designed to seamlessly implement both of these protocols.

For purposes of the present invention, the term "Internet" is a global system of interconnected computer networks that interchange data by packet switching using the standardized Internet Protocol Suite (TCP/IP). It is a "network of networks" that consists of millions of private and public, academic, business, and government networks of local to global scope that are linked by copper wires, fiber-optic cables, wireless connections, and other technologies. The Internet carries various information resources and services, such as electronic mail, online chat, file transfer and file sharing, online gaming, and the inter-linked hypertext documents and other resources of the World Wide Web (WWW).

For purposes of the present invention, the term "intranet" refers to a set of networks, using the Internet Protocol and IP-based tools such as web browsers and file transfer applications that are under the control of a single administrative entity. That administrative entity closes the intranet to all but specific, authorized users. Most commonly, an intranet is the internal network of an organization. A large intranet will typically have at least one web server to provide users with organizational information. Intranets may or may not have connections to the Internet. If connected to the Internet, the intranet is normally protected from being accessed from the Internet without proper authorization. The Internet is not considered to be a part of the intranet.

For purposes of the present invention, the term "inversion region of operation," "inversion operating region," "inversion region," "operate in inversion," "operating in inversion," or "inversion operation regime" may be used interchangeably to refer to an operational mode, condition, state or phenomena and attributes or characteristics resulting therefrom, wherein a voltage applied across a metal oxide semiconductor (MOS) device, i.e., voltage drop magnitude across the insulating layer of MOS capacitor, is greater than the magnitude of the threshold voltage associated with the MOS device, such that the induced electric field penetrates through the insulating layer (i.e. the oxide layer) and inverts the polarity of the semiconductor material disposed at or near the oxide-semiconductor interface. In other words, as a result of an applied voltage drop magnitude across a MOS device, such as a MOS capacitor (MOSCAP), in excess of the threshold voltage magnitude associated with the MOS device (i.e. MOS capacitor) the semiconductor material near the oxide-semiconductor interface, i.e., near the silicon/silicon dioxide ($Si/SiO_2$) interface, becomes inverted and, for example, starts acting like n-type silicon in a p-type substrate or a p-type silicon in an n-type substrate. This means that minority charges (i.e., electrons in a p-type substrate and holes in an n-type substrate) form in the substrate at or near the semiconductor-oxide interface as a result of the applied voltage drop magnitude across the MOS device. As the applied voltage drop magnitude is further increased passed the threshold voltage magnitude, due to an exponential increase in the concentration of charge carriers in the inversion layer in response thereof, the depletion layer width barely increases further (depletion capacitance barely reduces further) with increasing applied voltage magnitude.

For purposes of the present invention, the term "local area network (LAN)" refers to a network covering a small geographic area, like a home, office, or building. Current LANs are most likely to be based on Ethernet technology. The cables to the servers are typically on Cat 5*e* enhanced cable, which will support IEEE 802.3 at 1 Gbit/s. A wireless LAN may exist using a different IEEE protocol, 802.11b, 802.11g or possibly 802.11n. The defining characteristics of LANs, in contrast to WANs (wide area networks), include their higher data transfer rates, smaller geographic range, and lack of a need for leased telecommunication lines. Current Ethernet or other IEEE 802.3 LAN technologies operate at speeds up to 10 Gbit/s.

For purposes of the present invention, the term "low powered wireless network" refers to an ultra-low powered wireless network between sensor nodes and a centralized device. The ultra-low power is needed by devices that need to operate for extended periods of time from small batteries energy scavenging technology. Examples of low powered wireless networks are ANT, ANT+, Bluetooth®, Low Energy (BLE), ZigBee and WiFi.

For purposes of the present invention, the term "machine-readable medium" refers to any tangible or non-transitory medium that is capable of storing, encoding or carrying instructions for execution by the machine and that cause the machine to perform any one or more of the methodologies of the present invention, or that is capable of storing, encoding or carrying data structures utilized by or associated with such instructions. The term "machine-readable medium" includes, but is limited to, solid-state memories, and optical and magnetic media. Specific examples of machine-readable media include non-volatile memory, including by way of example, semiconductor memory devices, e.g., EPROM, EEPROM, and flash memory devices; magnetic disks such as internal hard disks and removable disks; magneto-optical disks; and CD-ROM and DVD-ROM disks. The term "machine-readable medium" may include a single medium or multiple media (e.g., a centralized or distributed database, and/or associated caches and servers) that store the one or more instructions or data structures.

For purposes of the present invention, the term "MEMS" refers to Micro-Electro-Mechanical Systems. MEMS, is a technology that in its most general form may be defined as miniaturized mechanical and electro-mechanical elements (i.e., devices and structures) that are made using the techniques of microfabrication. The critical physical dimensions of MEMS devices can vary from well below one micron on the lower end of the dimensional spectrum, all the way to several millimeters. Likewise, the types of MEMS devices can vary from relatively simple structures having no moving elements, to extremely complex electromechanical systems with multiple moving elements under the control of integrated microelectronics. A main criterion of MEMS may include that there are at least some elements having some sort of mechanical functionality whether or not these elements can move. The term used to define MEMS varies in different parts of the world. In the United States they are predominantly called MEMS, while in some other parts of the world they are called "Microsystems Technology" or "micromachined devices." While the functional elements of MEMS are miniaturized structures, sensors, actuators, and microelectronics, most notable elements may include microsensors and microactuators. Microsensors and microactuators may be appropriately categorized as "transducers," which are defined as devices that convert energy from one form to another. In the case of microsensors, the device typically converts a measured mechanical signal into an electrical signal.

For purposes of the present invention, the term "mesh networking" refers to a type of networking where each node must not only capture and disseminate its own data, but also serve as a relay for other nodes, that is, it must collaborate to propagate the data in the network. A mesh network can be designed using a flooding technique or a routing technique. When using a routing technique, the message is propagated along a path, by hopping from node to node until the destination is reached. To ensure all its paths' availability, a routing network must allow for continuous connections and reconfiguration around broken or blocked paths, using self-healing algorithms. A mesh network whose nodes are all connected to each other is a fully connected network. Mesh networks can be seen as one type of ad hoc network. Mobile ad hoc networks and mesh networks are therefore closely related, but mobile ad hoc networks also have to deal with the problems introduced by the mobility of the nodes. The self-healing capability enables a routing based network to operate when one node breaks down or a connection goes bad. As a result, the network is typically quite reliable, as there is often more than one path between a source and a destination in the network. Although mostly used in wireless situations, this concept is also applicable to wired networks and software interaction.

For purposes of the present invention, the term "mobile ad hoc network" is a self-configuring infrastructureless network of mobile devices connected by wireless. Ad hoc is Latin and means "for this purpose". Each device in a mobile ad hoc network is free to move independently in any direction, and will therefore change its links to other devices frequently. Each must forward traffic unrelated to its own use, and therefore be a router. The primary challenge in building a mobile ad hoc network is equipping each device to continuously maintain the information required to properly route traffic. Such networks may operate by themselves or may be connected to the larger Internet. Mobile ad hoc networks are a kind of wireless ad hoc networks that usually has a routable networking environment on top of a Link Layer ad hoc network. The growths of laptops and wireless networks have made mobile ad hoc networks a popular research topic since the mid-1990s. Many academic papers evaluate protocols and their abilities, assuming varying degrees of mobility within a bounded space, usually with all nodes within a few hops of each other. Different protocols are then evaluated based on measure such as the packet drop rate, the overhead introduced by the routing protocol, end-to-end packet delays, network throughput etc.

For purposes of the present invention, the term "network hub" refers to an electronic device that contains multiple ports. When a packet arrives at one port, it is copied to all the ports of the hub for transmission. When the packets are copied, the destination address in the frame does not change to a broadcast address. It does this in a rudimentary way, it simply copies the data to all of the Nodes connected to the hub. This term is also known as hub. The term "Ethernet hub," "active hub," "network hub," "repeater hub," "multiport repeater" or "hub" may also refer to a device for connecting multiple Ethernet devices together and making them act as a single network segment. It has multiple input/output (I/O) ports, in which a signal introduced at the input of any port appears at the output of every port except the original incoming. A hub works at the physical layer (layer 1) of the OSI model. The device is a form of multiport repeater. Repeater hubs also participate in collision detection, forwarding a jam signal to all ports if it detects a collision.

For purposes of the present invention, the term "non-transient storage medium" refers to a storage medium that is non-transitory, tangible and computer readable. Non-transient storage medium may refer generally to any durable medium known in the art upon which data can be stored and later retrieved by data processing circuitry operably coupled with the medium. A non-limiting non-exclusive list of exemplary non-transitory data storage media may include magnetic data storage media (e.g., hard disc, data tape, etc.), solid state semiconductor data storage media (e.g., SDRAM, flash memory, ROM, etc.), and optical data storage media (e.g., compact optical disc, DVD, etc.).

For purposes of the present invention, the term "processor" refers to a device that performs the basic operations in a computer. A microprocessor is one example of a processor For purposes of the present invention, the term "radiation sensitive" refers to the condition of exhibiting an alteration in one or more intrinsic/extrinsic parameters.

For purposes of the present invention, the term "radiation sensitive" refers to the condition of exhibiting an alteration in one or more intrinsic/extrinsic parameters.

For purposes of the present invention, the term "radiation-induced capacitance response" refers to an alteration in the capacitance parameter in response to exposure to radiation or as a result of interaction with radiation.

For purposes of the present invention, the term "radiation-induced capacitance response" refers to an alteration in the capacitance parameter in response to exposure to radiation or as a result of interaction with radiation.

For purposes of the present invention, the term "radiation-sensitive oxide layer" refers to alteration in electric field within oxide layer in response to the absorption of radiation that incident upon the oxide layer.

For purposes of the present invention, the term "radiation-sensitive MOSCAP" refers to a MOSCAP that produces a response in terms of a shift in threshold voltage and/or capacitance parameter.

For purposes of the present invention, the term "random-access memory (RAM)" refers to a type of computer data storage. Today it takes the form of integrated circuits that allow the stored data to be accessed in any order, i.e. at random. The word random thus refers to the fact that any piece of data can be returned in a constant time, regardless of its physical location and whether or not it is related to the previous piece of data. This contrasts with storage mechanisms such as tapes, magnetic discs and optical discs, which rely on the physical movement of the recording medium or a reading head. In these devices, the movement takes longer than the data transfer, and the retrieval time varies depending on the physical location of the next item. The word RAM is mostly associated with volatile types of memory (such as DRAM memory modules), where the information is lost after the power is switched off. However, many other types of memory are RAM as well, including most types of ROM and a kind of flash memory called NOR-Flash.

For purposes of the present invention, the term "read-only memory (ROM)" refers to a class of storage media used in computers and other electronic devices. Because data stored in ROM cannot be modified (at least not very quickly or easily), it is mainly used to distribute firmware (software that is very closely tied to specific hardware, and unlikely to require frequent updates). In its strictest sense, ROM refers only to mask ROM (the oldest type of solid state ROM), which is fabricated with the desired data permanently stored in it, and thus can never be modified. However, more modern types such as EPROM and flash EEPROM can be erased and re-programmed multiple times; they are still described as "read-only memory" because the reprogramming process is generally infrequent, comparatively slow, and often does not permit random access writes to individual memory locations.

For purposes of the present invention, the term "real-time processing" refers to a processing system designed to handle workloads whose state is constantly changing. Real-time processing means that a transaction is processed fast enough for the result to come back and be acted on as transaction events are generated. In the context of a database, real-time databases are databases that are capable of yielding reliable responses in real-time. For purposes of the present invention, the term "router" refers to a networking device that forwards data packets between networks using headers and forwarding tables to determine the best path to forward the packets. Routers work at the network layer of the TCP/IP model or layer 3 of the OSI model. Routers also provide interconnectivity between like and unlike media devices. A router is connected to at least two networks, commonly two LANs or WANs or a LAN and its ISP's network.

For purposes of the present invention, the term "received radiation dose" and "absorbed radiation dose" are used interchangeably to refer to radiation dose to which a radiation sensor, such as, for example, a MOSCAP or a radiation-sensitive MOSCAP, has been exposed or radiation dose that is incident upon a radiation sensor, such as, a MOSCAP or a radiation-sensitive MOSCAP.

For purposes of the present invention, the term "server" refers to a system (software and suitable computer hardware) that responds to requests across a computer network to provide, or help to provide, a network service. Servers can be run on a dedicated computer, which is also often referred to as "the server," but many networked computers are capable of hosting servers. In many cases, a computer can provide several services and have several servers running Servers may operate within a client-server architecture and may comprise computer programs running to serve the requests of other programs—the clients. Thus, the server may perform some task on behalf of clients. The clients typically connect to the server through the network but may run on the same computer. In the context of Internet Protocol (IP) networking, a server is a program that operates as a socket listener. Servers often provide essential services across a network, either to private users inside a large organization or to public users via the Internet. Typical computing servers are database server, file server, mail server, print server, web server, gaming server, application server, or some other kind of server. Numerous systems use this client/server networking model including Web sites and email services. An alternative model, peer-to-peer networking may enable all computers to act as either a server or client as needed.

For purposes of the present invention, the term "solid state sensor" refers to sensor built entirely from a solid-phase material such that the electrons or other charge carriers produced in response to the measured quantity stay entirely with the solid volume of the detector, as opposed to gas-discharge or electro-mechanical sensors. Pure solid-state sensors have no mobile parts and are distinct from electro-mechanical transducers or actuators in which mechanical motion is created proportional to the measured quantity.

For purposes of the present invention, the term "solid-state electronics" refers to those circuits or devices built entirely from solid materials and in which the electrons, or other charge carriers, are confined entirely within the solid material. The term is often used to contrast with the earlier technologies of vacuum and gas-discharge tube devices and it is also conventional to exclude electro-mechanical devices (relays, switches, hard drives and other devices with moving parts) from the term solid state. While solid-state can include crystalline, polycrystalline and amorphous solids and refer to electrical conductors, insulators and semiconductors, the building material is most often a crystalline semiconductor. Common solid-state devices include transistors, microprocessor chips, and RAM. A specialized type of RAM called flash RAM is used in flash drives and more recently, solid state drives to replace mechanically rotating magnetic disc hard drives. More recently, the integrated circuit (IC), the light-emitting diode (LED), and the liquid-crystal display (LCD) have evolved as further examples of solid-state devices. In a solid-state component, the current is confined to solid elements and compounds engineered specifically to switch and amplify it.

For purposes of the present invention, the term "storage medium" refers to any form of storage that may be used to store bits of information. Examples of storage include both volatile and non-volatile memories such as MRRAM, MRRAM, ERAM, flash memory, RFID tags, floppy disks, Zip™ disks, CD-ROM, CD-R, CD-RW, DVD, DVD-R, flash memory, hard disks, optical disks, etc. Two or more storage media acting similarly to a single data storage medium may be referred to as a "storage medium" For purposes of the present invention. A storage medium may be part of a computer.

For purposes of the present invention, the term "switchingly coupled" refers to a condition wherein coupling is established through a switch. Such that a closed switch corresponds to a coupled state, whereas an open switch corresponds to an uncoupled state.

For purposes of the present invention, the term "time" refers to a component of a measuring system used to sequence events, to compare the durations of events and the intervals between them, and to quantify the motions of objects. Time is considered one of the few fundamental quantities and is used to define quantities such as velocity. An operational definition of time, wherein one says that observing a certain number of repetitions of one or another standard cyclical event (such as the passage of a free-swinging pendulum) constitutes one standard unit such as the second, has a high utility value in the conduct of both advanced experiments and everyday affairs of life. Temporal measurement has occupied scientists and technologists, and was a prime motivation in navigation and astronomy. Periodic events and periodic motion have long served as standards for units of time. Examples include the apparent motion of the sun across the sky, the phases of the moon, the swing of a pendulum, and the beat of a heart. Currently, the international unit of time, the second, is defined in terms of radiation emitted by cesium atoms.

For purposes of the present invention, the term "timestamp" refers to a sequence of characters, denoting the date and/or time at which a certain event occurred. This data is usually presented in a consistent format, allowing for easy comparison of two different records and tracking progress over time; the practice of recording timestamps in a consistent manner along with the actual data is called timestamping. Timestamps are typically used for logging events, in which case each event in a log is marked with a timestamp. In file systems, timestamp may mean the stored date/time of creation or modification of a file. The International Organization for Standardization (ISO) has defined ISO 8601 which standardizes timestamps.

For purposes of the present invention, the term "transmission control protocol (TCP)" refers to one of the core protocols of the Internet Protocol Suite. TCP is so central that the entire suite is often referred to as "TCP/IP." Whereas IP handles lower-level transmissions from computer to computer as a message makes its way across the Internet, TCP operates at a higher level, concerned only with the two end systems, for example a Web browser and a Web server. In particular, TCP provides reliable, ordered delivery of a stream of bytes from one program on one computer to another program on another computer. Besides the Web, other common applications of TCP include e-mail and file transfer. Among its management tasks, TCP controls message size, the rate at which messages are exchanged, and network traffic congestion.

For purposes of the present invention, the term "visual display device" or "visual display apparatus" includes any type of visual display device or apparatus such as a CRT monitor, LCD screen, LEDs, a projected display, a printer for printing out an image such as a picture and/or text, etc. A visual display device may be a part of another device such as a computer monitor, television, projector, telephone, cell phone, smartphone, laptop computer, tablet computer, handheld music and/or video player, personal data assistant (PDA), handheld game player, head mounted display, a heads-up display (HUD), a global positioning system (GPS) receiver, automotive navigation system, dashboard, watch, microwave oven, electronic organ, automatic teller machine (ATM) etc.

For purposes of the present invention, the term "wearable device" refers to a device that may be mounted, fastened or attached to a user or any part of a user's clothing, or incorporated into items of clothing and accessories which may be worn on the body of a user. In some embodiments, wearable device refers to wearable technology, wearables, fashionable technology, tech togs, fashion electronics, clothing and accessories, such as badges, watches, and jewelry incorporating computer and advanced electronic technologies.

For purposes of the present invention, the term "web service" refers to the term defined by the W3C as "a software system designed to support interoperable machine-to-machine interaction over a network". Web services are frequently just web APIs that can be accessed over a network, such as the Internet, and executed on a remote system hosting the requested services. The W3C Web service definition encompasses many different systems, but in common usage the term refers to clients and servers that communicate using XML messages that follow the SOAP standard. In such systems, there is often machine-readable description of the operations offered by the service written in the Web Services Description Language (WSDL). The latter is not a requirement of a SOAP endpoint, but it is a prerequisite for automated client-side code generation in many Java and .NET SOAP frameworks. Some industry organizations, such as the WS-I, mandate both SOAP and WSDL in their definition of a Web service. More recently, RESTful Web services have been used to better integrate with HTTP compared to SOAP-based services. They do not require XML messages or WSDL service-API definitions.

For purposes of the present invention, the term "wide area network (WAN)" refers to a data communications network that covers a relatively broad geographic area (i.e. one city to another and one country to another country) and that often uses transmission facilities provided by common carriers, such as telephone companies. WAN technologies generally function at the lower three layers of the OSI reference model: the physical layer, the data link layer, and the network layer.

For purposes of the present invention, the term "World Wide Web Consortium (W3C)" refers to the main international standards organization for the World Wide Web (abbreviated WWW or W3). It is arranged as a consortium where member organizations maintain full-time staff for the purpose of working together in the development of standards for the World Wide Web. W3C also engages in education and outreach, develops software and serves as an open forum for discussion about the Web. W3C standards include: CSS, CGI, DOM, GRDDL, HTML, OWL, RDF, SVG, SISR, SOAP, SMIL, SRGS, SSML, VoiceXML, XHTML+ Voice, WSDL, XACML. XHTML, XML, XML Events, Xforms, XML Information, Set, XML Schema, Xpath, Xquery and XSLT.

DESCRIPTION

While the present invention is disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof. It is understood that other embodiments may be utilized and structural changes may be made without departing from the scope of the invention.

A conventional solution to solid-state dosimetry includes the metal-oxide-semiconductor field-effect transistor (MOSFET) radiation dosimeter. When the MOSFET is exposed to ionizing radiation electron hole pairs are generated in the oxide insulation layer. The junction potential between the device layers, or an applied positive potential to the gate, causes the electrons (whose mobility in $SiO_2$ at room temperature is about four orders of magnitude greater than holes) to quickly move towards the positively biased contact while the holes migrate to the oxide-silicon interface where they are trapped. These trapped charges cause a shift in the threshold voltage, since a larger negative voltage must be applied to the gate to overcome the electric field of the trapped charges. The threshold voltage shift is proportional to the radiation dose deposited in the oxide layer and this relationship is the basis for using MOSFETs as dosimeters.

The formation of radiation-induced oxide fixed charges densities, as a result of ionizing radiation passing through the oxide layer of a MOSFET sensor, permanently shifts the device threshold voltage parameter. By detecting this change in threshold voltage with an electronic circuit, the dose received can be determined. Several of the shortcomings associated with MOSFET radiation sensors, as discussed above, is overcome by utilizing the capacitance change resulting from incident radiation instead of utilizing the threshold voltage shift (as in MOSFET radiation sensors) for representing the radiation response of a MOS Si/SiO$_2$ device. This is in part due to the high sensitivity and precision of capacitance measurement electronics that far exceeds that of voltage measurement circuitry. Disclosed embodiments utilize the capacitance measurement circuitry as among the most sensitive available and results in a lower minimum resolvable dose, thus making a metal oxide semiconductor (MOS) based capacitive radiation sensing system viable for occupational dosimetry applications, capable of precise real-time measurement and readout of sensor data hence, enabling continuous monitoring of absorbed radiation dose.

Additional limitations associated with the measurement and readout of a threshold voltage shift (in response to the radiation-induced build-up of an oxide trapped charge for estimating the absorbed dosage(s) of radiation(s)) includes the requirement of a wired readout circuit. Using the same principle of oxide-trapped charge build-up, but by monitoring the change in capacitance (instead of threshold voltage), a wireless dose sensor is disclosed in the present invention. The disclosed sensor element is a custom MOS capacitor (MOSCAP) which traps holes in proportion to the amount of ionizing radiation detected, thus permanently causing a lateral shift in the capacitance-voltage (C-V) response toward a more negative threshold voltage. A capacitive readout circuit, coupled to the output of one or more radiation-sensitive metal oxide semiconductor capacitors (MOSCAPs), measures the capacitance value of several redundant sensors at a given voltage in the depletion operation regime, records this value over time and occasionally transmits the stored values to a base station (i.e., any device or system with one or more serial interfaces capable, for example, of 2.4 Ghz communication, including peripheral devices such as workstations, laptops, tablet computers, desktop computers, etc.) via an on-board wireless transceiver IC.

Constructing a radiation-sensitive MOSCAP sensor, according to disclosed embodiments, involves a structural alterations to the conventional MOSFET structure, namely removing the source and drain implants, making the gate electrode larger, and gate oxide thicker. The final structure is a MOS capacitor or MOSCAP. FIG. 1 illustrates a MOSCAP structure 100 in both unbiased configuration 101 and externally biased configuration 103. The MOSCAP structures 100 comprise a bottom conductive layer 102, a top conductive layer 104, and an insulating layer 106 sandwiched there in between. The bottom conductive layer 102 may comprise a silicon substrate and the top conductive layer 104 may comprise a polysilicon or metal layer. The insulting layer 106 may comprise a radiation-sensitive oxide layer. In one embodiment of the present invention the bottom conductive layer 102 may be produced from a p-type doped silicon substrate. In select embodiments of the present invention the radiation-sensitive oxide layer 106 may comprise silicon dioxide layer (SiO$_2$). Since the top conductive layer 104 also acts as the gate of a MOS transistor, the top conductive layer 104 is also referred to as the gate electrode. Conducting contact 108 are made to the top conductive layer 104 and conducting contact 110 are made to the bottom conductive layer 102, in order to electrically connect the apparatus to other electronic devices. In one embodiment of the present invention the conducting contact may comprise a titanium/gold compound that may be bonded to pins of a gold-plated TO header package for external connectivity.

A key feature of the MOSCAP is its voltage dependent capacitance, which is a manifestation of the same material properties behind the switching behavior of MOSFETs. Therefore, it is possible to perform C-V characterization on the MOSCAP device in order to assess voltage-dependent capacitance response and voltage values delineating its discrete regions of operation in accordance to the response trace illustrated in FIG. 2. The physical picture of the MOSCAP is that, depending on the gate voltage, majority or minority charge carriers can fill silicon energy sub-bands at the substrate-Oxide (Si/SiO$_2$) interface due to band bending of the silicon conduction and valence bands; also, the bulk of the semiconductor can become depleted of the majority charge carriers. The depletion or accumulation of charges at the semiconductor interface is controlled by the gate voltage.

Figure 2:
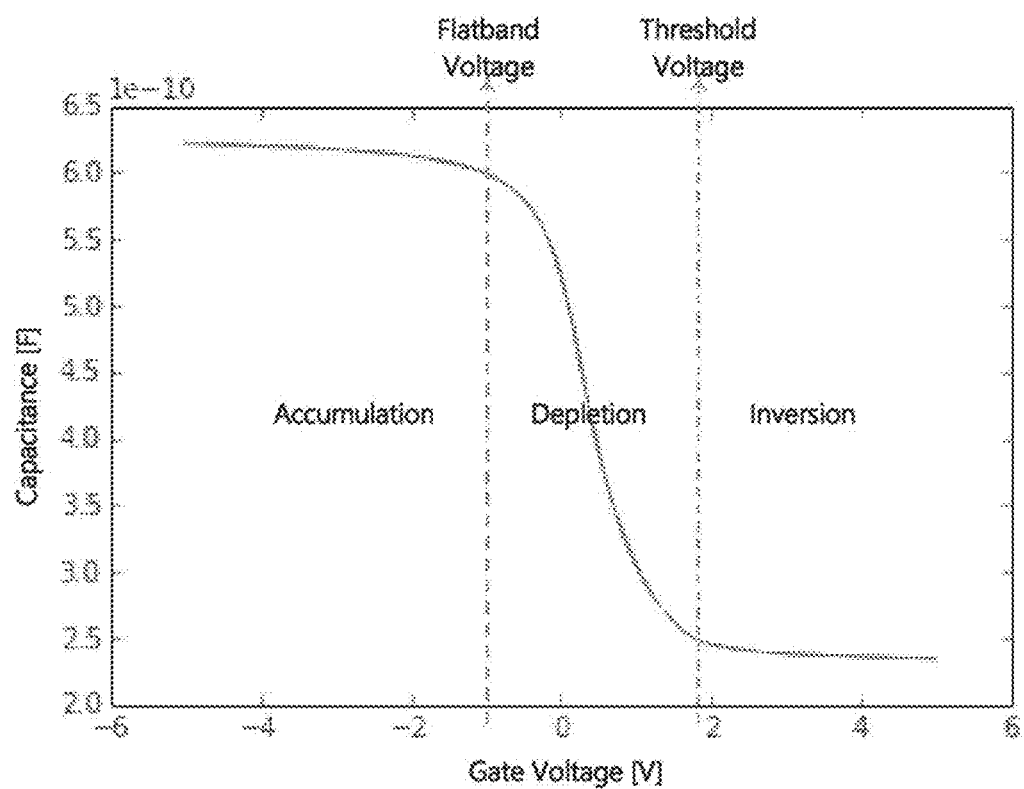
FIG. 2 is an illustration of the C-V response of a radiation-sensitive MOSCAP as a function an external bias applied across the radiation-sensitive oxide layer, according to one embodiment of the present invention.

The maximum capacitance that the MOSCAP can attain is the oxide capacitance. The oxide capacitance is the capacitance that the device approaches for gate voltages less than the flatband voltage as illustrated in FIG. 2. The capacitance changes with voltage, because an insulating region, that is depleted of charge carriers, forms in the semiconductor as the gate voltage is increased past the flatband voltage. Under accumulation conditions, the device capacitance is the same as the oxide capacitance. Since carriers can easily be moved to and from the interface, the charges build up at both sides of the oxide as in a parallel plate capacitor. This changes as the applied bias voltage (henceforth, referenced interchangeably as Gate voltage) becomes positive, thereby, creating a depletion layer in the semiconductor. This depletion layer prevents carriers from moving towards the semiconductor-oxide interface. The variation of the charge, therefore, occurs at the edge of the depletion region so that the measured capacitance is the series connection of the oxide capacitance and the depletion layer capacitance. The depletion region, forming a series capacitance with the oxide capacitance, varies inversely with the depth of the depletion layer. Since depletion width is dependent on the gate voltage, the semiconductor capacitance becomes dependent on the gate voltage. As the depletion width approaches zero, the total capacitance approaches the oxide capacitance. From the gate voltage dependent capacitance response curve in FIG. 2, it can also be seen that the capacitance reaches its minimum (depletion region reaches its maximum width) for applied bias voltages greater than the threshold voltage. This is the inversion region of the MOSCAP operation, referenced accordingly in FIG. 2. In this region the depletion layer width, hence, the MOSCAP capacitance, is almost independent of the applied bias voltage yielding a constant (and minimum) capacitance. The total capacitance can be obtained from a series connection of the oxide capacitance and the minimum capacitance of the depletion layer.

Figure 3:
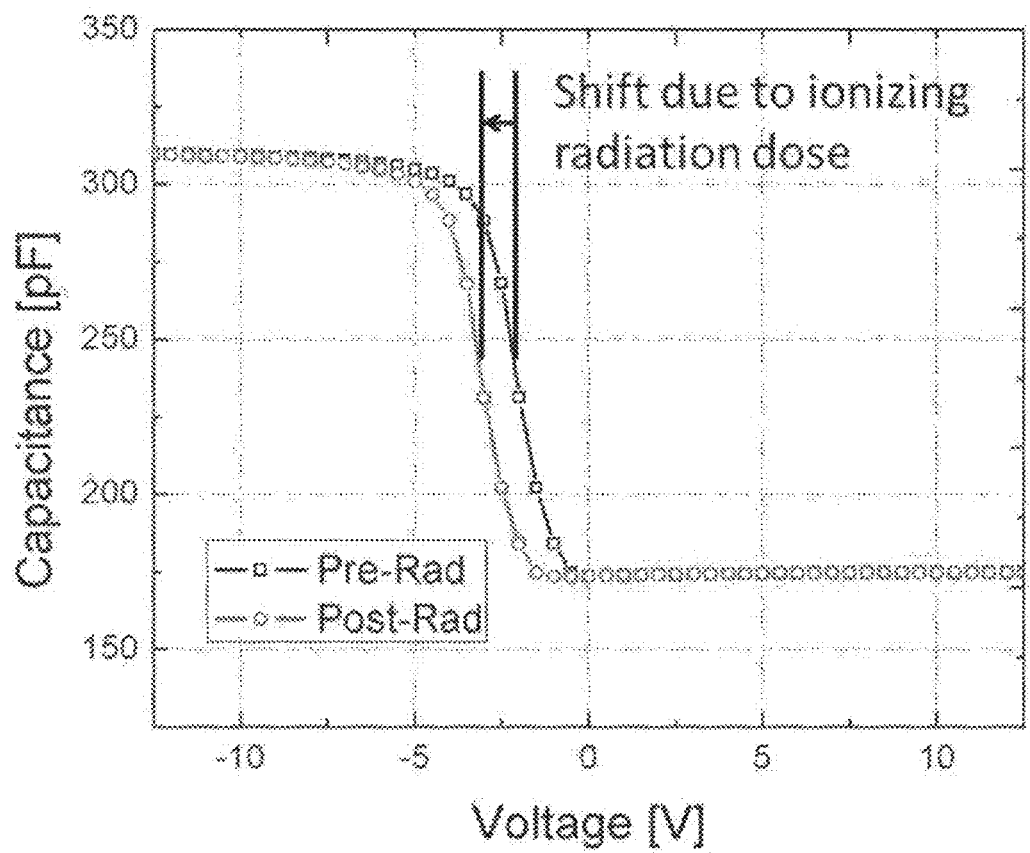
FIG. 3 is a graph illustrating the radiation-induced capacitance response of a radiation-sensitive MOSCAP represented by a shift in the C-V response of the device, according to one embodiment of the present invention.

The interaction of semiconductor and insulating solids with radiation is understood as the creation of electron hole pairs (e-h) through ionization of individual atoms by primary and secondary particles. Subsequent to their creation, these charges can either recombine in the material, discharge through conduction, or become trapped. If charges are trapped and, therefore, present in the oxide, they too can change the semiconductor depletion region width in the same way the gate voltage can. Any increase in oxide charge density will affect the semiconductor depletion region width, which results in a capacitance change. Trapped positive charges create an electric field in the oxide, and appear as an added positive gate voltage. This results in an increasingly negative threshold voltage and a negative voltage shift in the C-V response curve of the MOSCAP device, as Illustrated in FIG. 3. Therefore the trapping of positive charges (holes) in the oxide layer created by the interaction of ionizing radiation and the oxide results in a radiation-induced capacitance response in the MOSCAP.

Following the radiation-induced electron-hole pair generation in the radiation-sensitive oxide layer of a MOSCAP sensor, the amount of initial recombination and hence annihilation of liberated charge is highly dependent on the electric field in the oxide and the energy and type of incident particle. In general, strongly ionizing particles form dense columns of charge where the recombination rate is relatively high. On the other hand, weakly ionizing particles generate relatively isolated charge pairs, and the recombination rate is lower.

Figure 4:
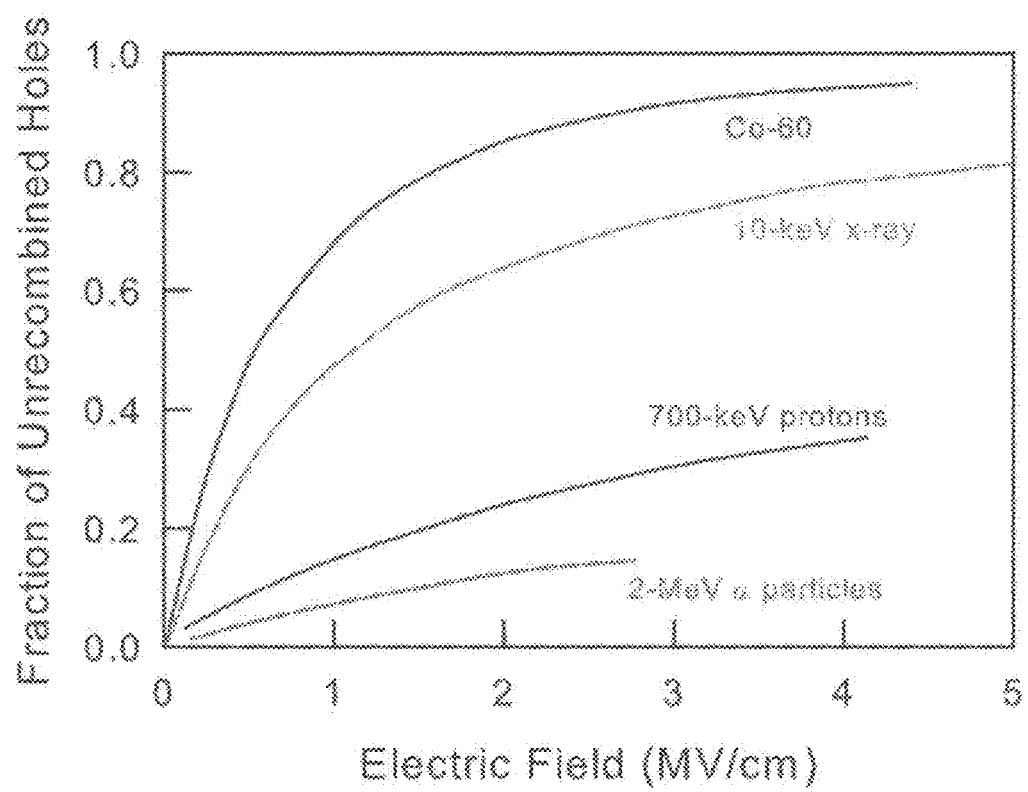
FIG. 4 is an illustration depicting the fraction of un-recombined holes as a function of the external bias voltage, according to one embodiment of the present invention.

The dependence of initial recombination on the electric field strength in the oxide for low-energy protons, alpha particles, gamma rays (Co-60), and x rays is illustrated in FIG. 4. Plotted in FIG. 4 is the fraction of un-recombined holes, also referred to as charge yield (liberated charges, as a result of absorbed radiation, that will actually contribute to the radiation response of the device) versus electric field in the oxide. For all radiation types, as the electric field strength increases, the probability that a hole will recombine with an electron decreases, and the fraction of un-recombined holes increases.

Figure 5:
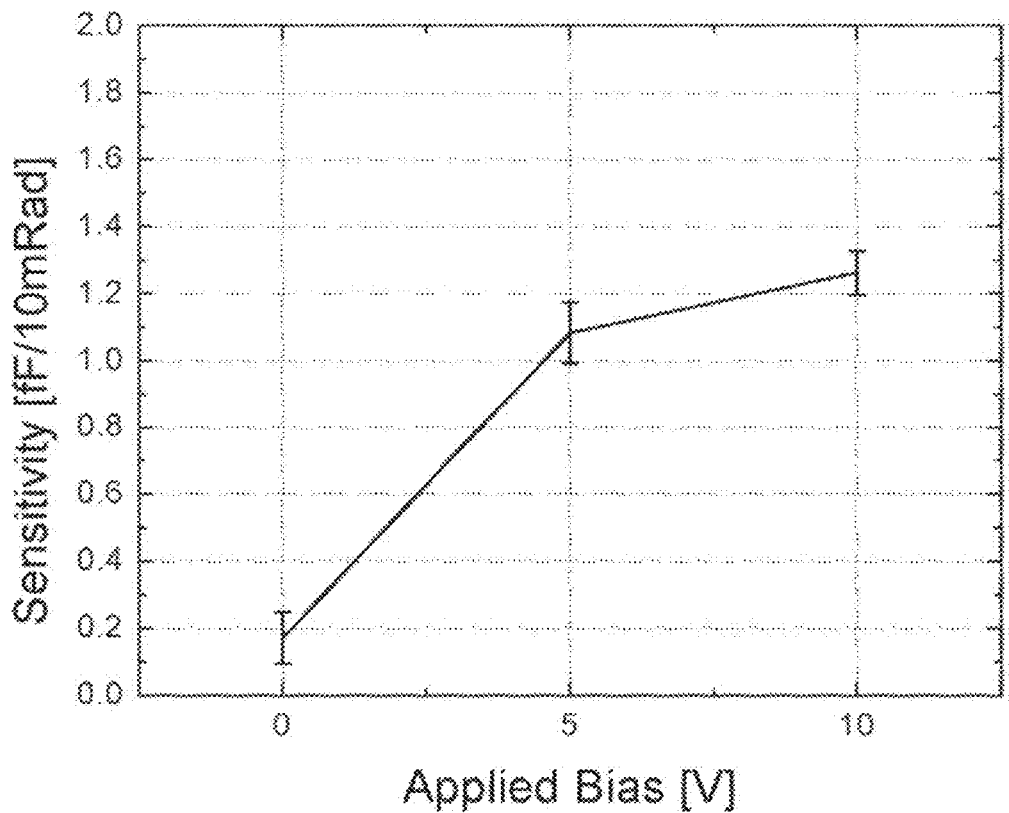
FIG. 5 is an illustration of the sensitivity of the radiation-induced capacitance response, associated with a radiation-sensitive MOSCAP, as a function of applied external bias voltage, according to one embodiment of the present invention.

Disclosed embodiments provide application of an external bias across the MOSCAP device increases the strength of the electric field that accelerates the liberated hole and electron pairs in opposite direction, thus impeding their recombination at the site of radiation absorption within the oxide. This is illustrated for the radiation-sensitive externally biased MOSCAP structure in FIG. 1. The efficiency of positive charge collection at the substrate/oxide ($Si/SiO_2$) interface where majority of hole trapping sites reside will, therefore, increase in response to the applied positive bias across a radiation-sensitive MOSCAP resulting in a greater shift in capacitance in response to absorbed radiation. This results in an enhanced radiation-induced capacitance response sensitivity. Capacitance response sensitivity as a function of applied bias is illustrated in FIG. 5. According to measured data presented in FIG. 5, a base-line sensitivity of 1.1 fF/mRad is established with applied external bias of 5V, in accordance with one embodiment of the present invention.

As discussed above, an absorbed radiation dose in the oxide layer of a MOS $Si/SiO_2$ device can more precisely be quantified by measurement of the change in the capacitance parameter in a MOSCAP device rather than the change in the threshold voltage parameter in a MOSFET device. The former yields significantly better resolution due to a greater precision of the available capacitance electronic measurement methodologies. Moreover, application of bias voltage across the radiation-sensitive oxide layer, in accordance with disclosed embodiments, can also increase the sensitivity of MOSCAP radiation response as illustrated in FIG. 4 and FIG. 5. Further enhancement of device radiation response sensitivity and resolution is achievable by controlling the device structural and process parameters. Three such parameters that can be selected to optimize the performance of the detector as a radiation dosimeter are the oxide thickness, the post-oxidation annealing time and temperature parameters.

The post-oxidation annealing (POA) temperature plays an important role in the buildup of oxygen vacancies, which is the primary type of defect responsible for oxide trapping of holes. This is attributed to the out-diffusion of oxygen at high temperatures, thus, leaving behind oxygen vacancy defects. High POA temperatures result in vacancies that lead to significantly increased radiation-induced oxide charge buildup.

Figure 6:
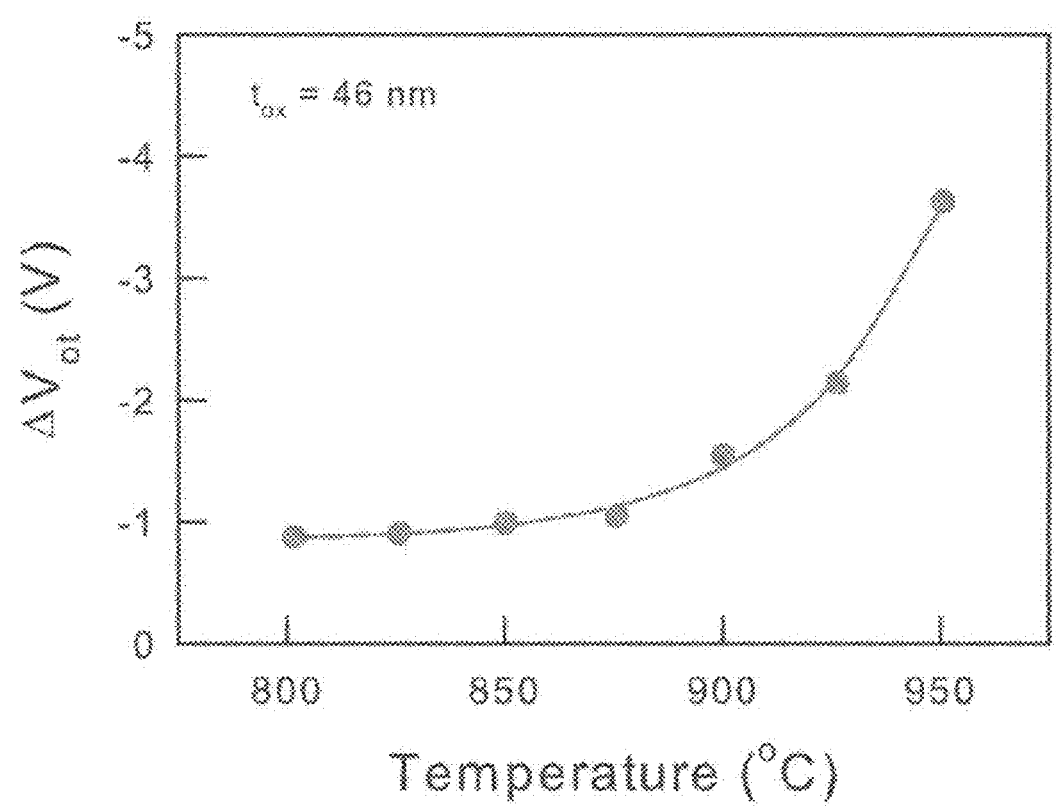
FIG. 6 is a graph illustrating the radiation sensitivity of a radiation-sensitive MOSCAP represented as the amount of radiation-induced shift in the device threshold voltage parameter as a function of the POA temperature, according to one embodiment of the present invention.

In one embodiment, radiation-sensitive MOSCAP with enhanced radiation sensitivity are fabricated at POA temperature of 1100° C. and compared with a radiation-sensitive MOSCAP structures with base-line radiation sensitivity fabricated at a POA of 400° C. The high temperature POA is expected to create an excess of hole traps in the $SiO_2$. The increase in hole traps resulting from high temperature POA expectedly leads to greater deviation in a radiation-induced shift in a MOSCAP's capacitance parameter which is a real-time measure of the absorbed radiation dose in the MOSCAP's radiation-sensitive oxide layer. This information may be gathered and subsequently processed, for example, in a computer system for further analysis. For example, described embodiments may provide saving a value of the absorbed radiation dose, for example, to a non-transient storage medium and/or displaying the value of the absorbed radiation dose to a user. The enhanced sensitivity exhibited by MOSCAP devices fabricated at high POA temperatures, in accordance to one aspect of the present invention, is illustrated by the measured data in FIG. 6. This embodiment presents a factor of four increase in the radiation-induced threshold voltage shift when the temperature parameter associated with the POA fabrication step is increased from 800° C. to 950° C. Furthermore, a voltage shift increase of a factor of 20 is achieved by increasing the POA temperature from 800° C. to 1200° C.

Figure 7:
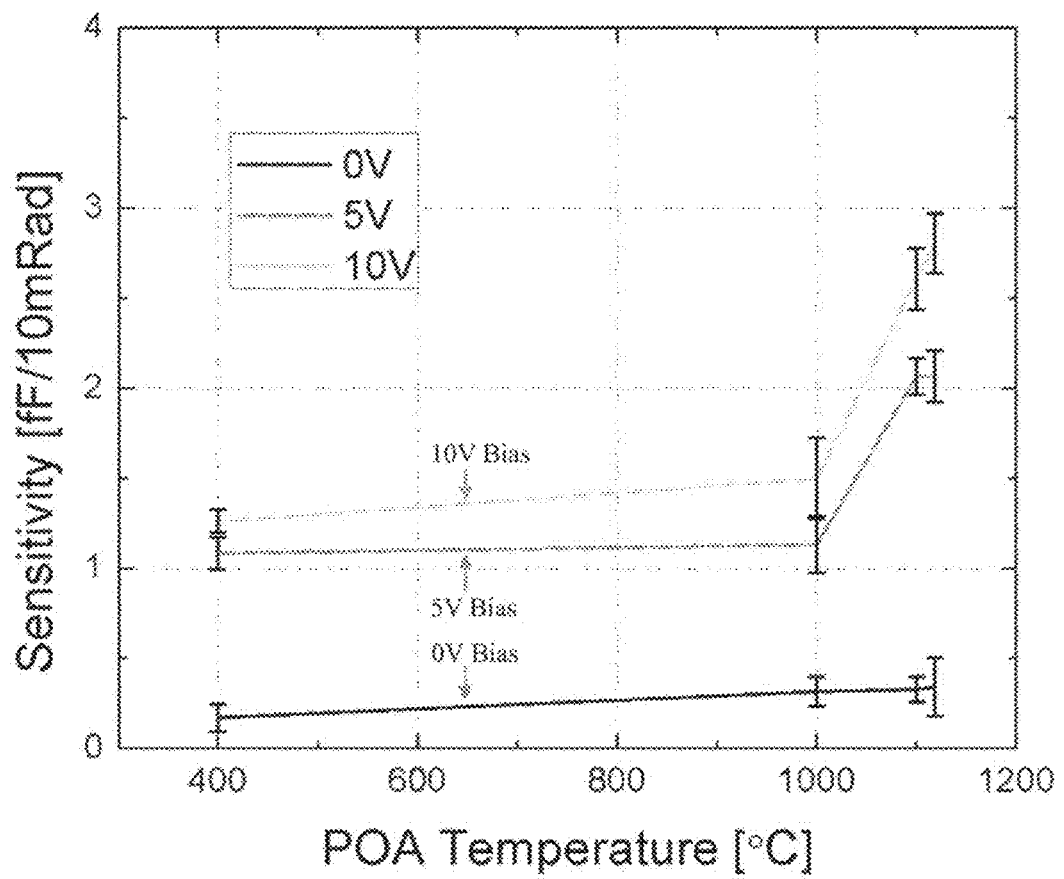
FIG. 7 is a graph illustrating the radiation-induced capacitance response sensitivity as a function of the POA temperature for three different values of external bias voltage applied across the radiation-sensitive MOSCAP, according to one embodiment of the present invention.

FIG. 7 illustrates radiation sensitivity in terms of change in capacitance as a function of the POA temperature, measured for a unbiased radiation-sensitive MOSCAP, a radiation-sensitive MOSCAP biased at 5V and a radiation-sensitive MOSCAP biased at 10V. As expected, higher POA temperatures increase sensitivity of radiation-induced capacitance response in radiation-sensitive MOSCAPs.

Figure 8:
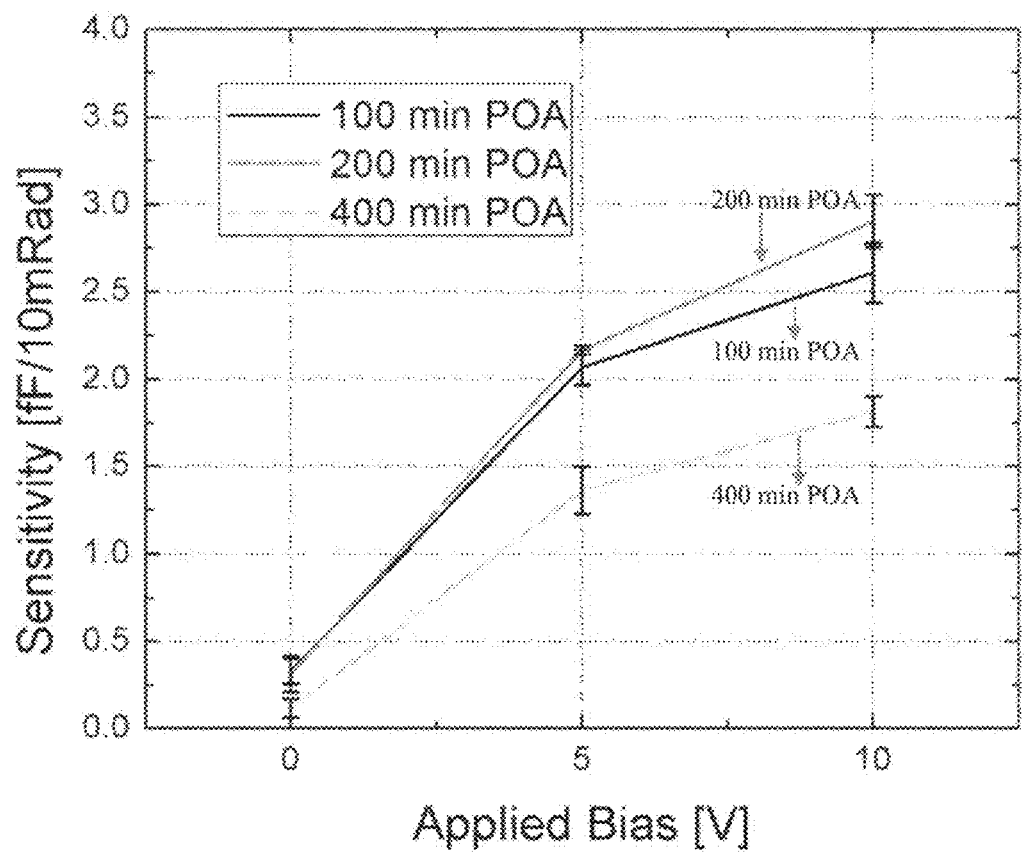
FIG. 8 is a graph illustrating the radiation-induced capacitance response sensitivity as a function of the external bias applied across the radiation-sensitive MOSCAP, measured for three different values of POA time parameter, according to an embodiment of the present invention.

FIG. 8 illustrates radiation sensitivity in terms of MOSCAP capacitance response measured as a function of the applied BIAS voltage at three different time parameters associated with the POA fabrication step. As observed from FIG. 8, longer POA times have a small effect on improving sensitivity, however above 200 minutes, the sensitivity starts to significantly decrease due to the reduction in the rate of change of MOSCAP capacitance with respect to the applied voltage. Therefore optimal results, in accordance to one aspect of the present invention, are associated with POA time parameters within a range of approximately 100-200 minutes.

In accordance to one aspect of the present invention, POA conducted at approximately 1100° C. for approximately 100 min in N2 results in near 100% trapping of the radiation-generated holes, increasing the radiation sensitivity of the respective MOSCAP, biased at 5V, by a factor of 2. At this point further improvement in sensitivity will be limited by the number of radiation-generated holes within the oxide. Therefore, increasing the sensitivity further requires a thicker oxide which will allow for the creation of more radiation-generated holes, which can fill the excess traps.

Figure 9:
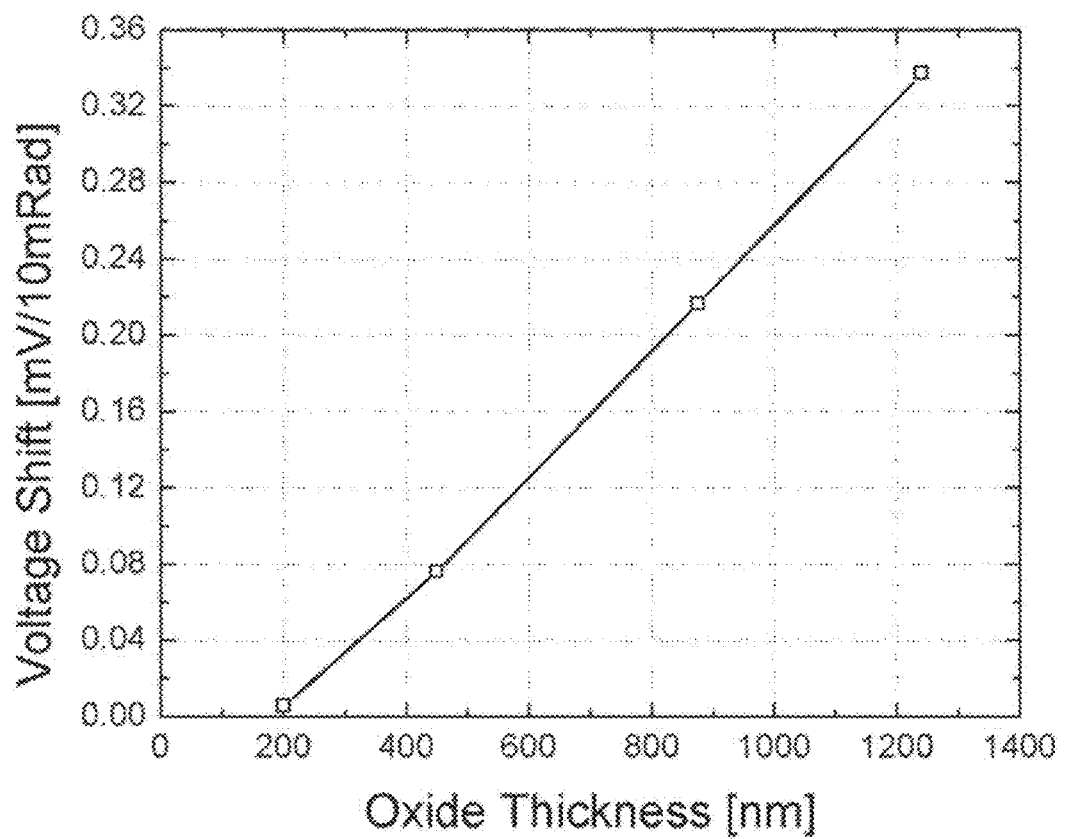
FIG. 9 is an illustration of the radiation-induced shift in the threshold voltage parameter as a function of the oxide layer thickness in a radiation-sensitive MOSCAP, according to one embodiment of the present invention.

FIG. 9 is an illustration of the radiation-induced shift in the threshold voltage parameter as a function of the oxide layer thickness in a radiation-sensitive MOSCAP, according to one embodiment of the present invention. If the oxide electric field is held constant, the sensitivity increases with the square of Oxide thickness ($t_{ox}^2$). However, if the oxide is unbiased then the sensitivity can no longer be assumed to be proportional to the square of the oxide thickness, because the sensitivity is now dominated by the intrinsic electric field of the pre-existing charged oxide defects and contact potential between the gate (Top conductive layer) and semiconductor (bottom conductive layer). The threshold voltage shift due to both charges decreases with a slightly less than a $t_{ox}^2$, dependence. For oxides thinner than 20 nm, sensitivity drop-off (in terms of the density of radiation-generated oxide-trapped charges whose amount decreases with an even faster dependence on Oxide thickness) is much more severe than $t_{ox}^2$ dependence. Thicker oxide results in larger voltage shift due to greater number of present oxide traps as well as the greater number of electron-hole pairs generated due to the increased volume available for the absorption of the incident radiation.

Figure 10:
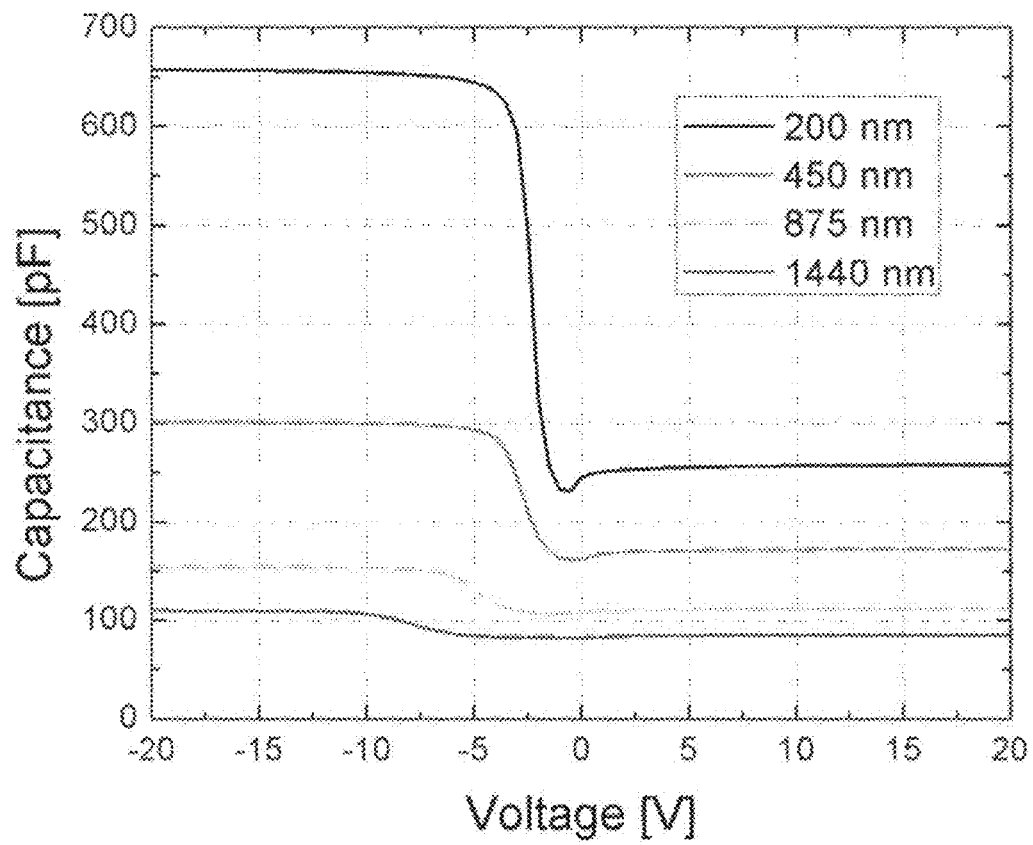
FIG. 10 is an illustration of the C-V response as a function of applied bias voltage for radiation-sensitive MOSCAP for varying oxide layer thickness values ranging from 200 nm to 1440 nm, according to one embodiment of the present invention.
Figure 11:
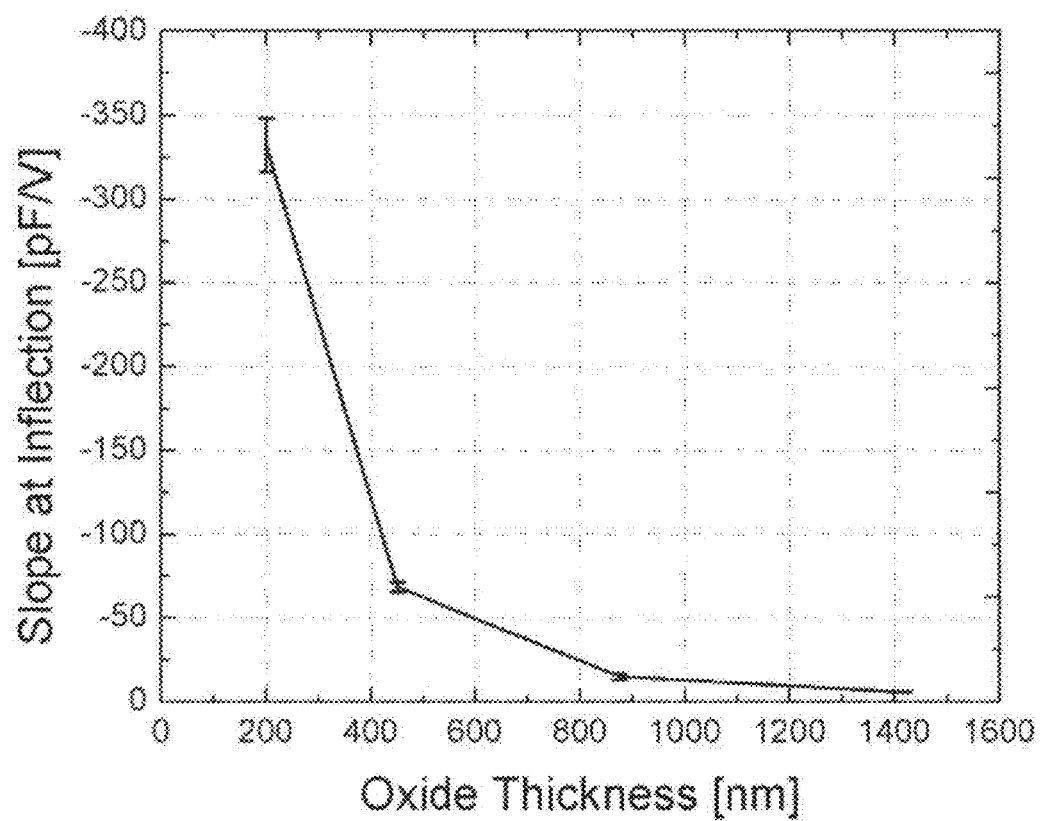
FIG. 11 is a graph illustrating the rate of change of radiation-induced capacitance response as a function of oxide layer thickness, according to one embodiment of the present invention.
Figure 12:
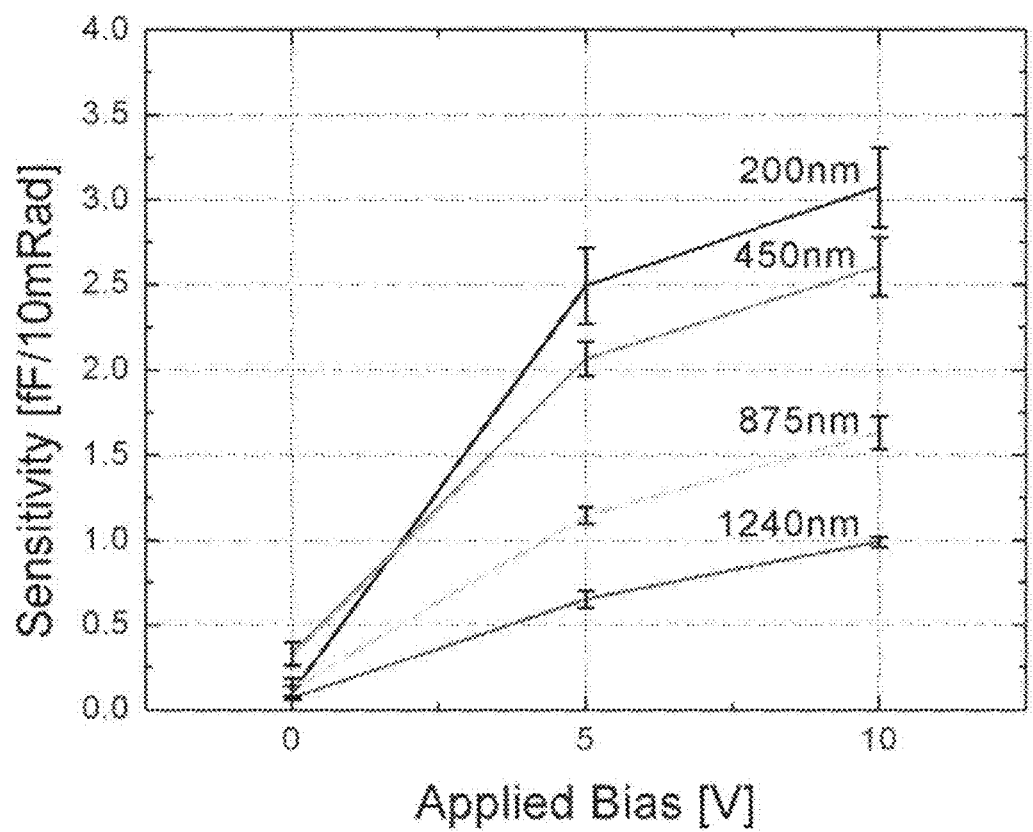
FIG. 12 is an illustration of the radiation-induced capacitance response sensitivity for a radiation-sensitive MOSCAP as a function of the applied bias measured for different thickness values of the oxide layer, according to one embodiment of the present invention.

However, as the oxide thickness increases, so does the gate voltage required to maintain a constant electric field. The measured data in FIG. 10 (representing the C-V response curve for MOSCAPs with different oxide thickness values) shows an inverse relationship wherein the slope of the C-V response curve decreases as the oxide layer thickness is increased. FIG. 11 demonstrates the slope of the C-V response curves in FIG. 10 as a function of gate oxide thickness at their respective inflection points. It is observed that the slope increases significantly for thinner oxides. Determining the radiation-induced capacitance response sensitivity of the MOSCAPs with different oxide thickness values requires multiplying the voltage shift values for the corresponding MOSCAPs from FIG. 9 by the inflection slope of the corresponding C-V response curves from FIG. 11 (rate of change capacitance with respect to voltage). FIG. 12 illustrates the resulting radiation-induced capacitance response sensitivity of the MOSCAP sensors with increasing oxide layer thickness parameters ranging from 200 nm to 1240 nm. According to the measurements shown in FIG. 12, the largest capacitance shift is actually obtained with thinnest oxide.

Figure 13:
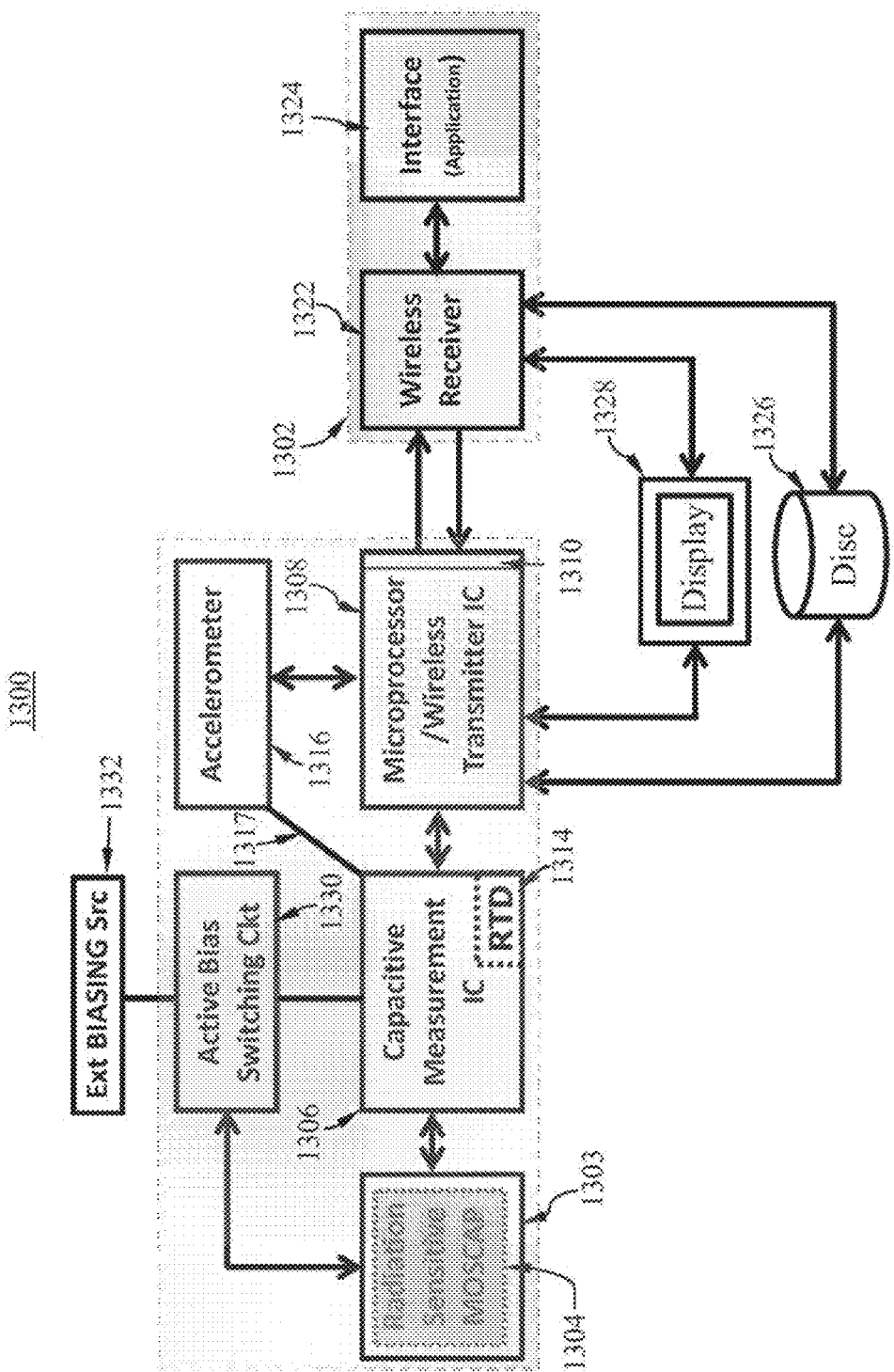
FIG. 13 is diagram illustrating the main functional units in a solid-state MOSCAP-based dosimeter system with real-time wireless radiation-dose reporting capability, according to one embodiment of the present invention.

FIG. 13 illustrates an exemplary solid-state dosimeter system 1300, in accordance to one embodiment of the present invention. The solid-state dosimeter system 1300 may comprise a front-end sensing/processing unit 1301 comprising of one or more on-board radiation sensing and signal processing elements and a far-end processing/reporting unit or a base station 1302. The front-end sensing/processing unit 1301 may comprise one or more capacitive sensing elements 1303 such as, for example, one or more radiation-sensitive MOSCAPs 1304. The front-end sensing/processing unit 1301 may also comprise a capacitive readout IC 1306 coupled to the one or more radiation-sensitive MOSCAPs 1304 for real-time measurement and digitization of the radiation-induced capacitance response in one or more radiation-sensitive MOSCAPs 1304. In some embodiments the front-end sensing/processing unit 1301 may further comprise a microprocessor/wireless transceiver integrated circuit (IC) 1308 for storage, processing and wireless transmission of the digital capacitance values provided by the capacitive readout IC 1306. The microprocessor/wireless transceiver IC 1308 may include a Bluetooth® controller (antenna transceiver) 1310 for establishing a Bluetooth® link to the far-end processing/reporting unit or base station 1302 to thereby enable automatic uploading of the radiation dose information, when the front-end sensing/processing unit 1301 is in proximity of the base station 1302. The front-end sensing/processing unit 1301 may further comprise additional functionality such as, for example, temperature sensing, for providing the necessary temperature measurements that may be used to compensate for the temperature induced drift in the measurement of the radiation-induced capacitance response in one or more radiation-sensitive MOSCAPs and a motion detection functionality for wake up operation and for verifying user presence during radiation exposure.

In the exemplary solid-state dosimeter system 1300, temperature sensing functionality may be provided by a resistive temperature detector (RTD) 1314. RTD element 1314 exhibits a predictable change in resistance as the temperature changes, therefore temperature sensing may be implemented by correlating the resistance of the RTD element 1314 with the operating temperature of the one or more radiation-sensitive MOSCAPs 1304.

In the exemplary solid-state dosimeter system 1300, motion detection functionality may be provided by an accelerometer 1316. In one embodiment of the present invention the accelerometer 1316 may comprise a microscopic crystal structure that exhibits a piezoelectric effect such that when the crystal structure is stressed by accelerative forces, it generates a voltage. In another embodiment accelerometer 1316 may sense changes in capacitance, for example, it may comprise two microstructures next to each other, having a certain capacitance between them. If an accelerative force moves one of the structures, then the capacitance between them will change. In such a case, the capacitive readout IC 1306 may be utilized to convert the capacitance change, detected across connection 1317, to a voltage value to thereby implement accelerometer functionality. This would be relevant in occupational dosimetry applications wherein the front-end sensing/processing unit 1301 of the solid-state dosimeter system 1300 may be implemented as a portable or wearable device. The data from the accelerometer 1316 may be used in conjunction with the radiation dose data from the capacitive readout IC 1306 and the microprocessor/wireless transceiver IC 1308 in order to indicate whether the front-end sensing/processing unit 1301 was carried by, worn by or attached to a user during radiation exposure. In select embodiments, the temperature and acceleration data may also be transmitted, for example, to the base station 1302 for further data processing, conditioning, interpretation or evaluation.

It is not the intention of the forgoing description or figures to place any restriction on the methodology utilized for generating the motion data that may be indicative of user operation during radiation exposure. As such, it should be noted that alternative means of generating motion data may be employed by the solid-state dosimeter system without departing from the scope of the present invention.

The far-end processing/reporting unit or the base station 1302 may comprise a wireless receiver 1322 and an application interface 1324. The wireless receiver 1322 may serve as a radio frequency (RF) signal interface for establishing a reliable wireless link with a RF transmitting element such as, for example, Bluetooth® low energy (BLE) controller or antenna transceiver 1310 that may be implemented on the front-end sensing/processing unit 1301, to thereby enable wireless exchange of information with the front-end sensing/processing unit 1301. The information received by the wireless receiver 1322 may then be processed by the application interface 1324 for user intended reporting and administration.

In select embodiments of the present invention, the relevant environmental data, such as, for example, the absorbed radiation dose, the ambient or sensor temperature data and the motion or acceleration related data, may be stored to a non-transient storage medium 1326 and/or displayed to a user on a display device 1328.

In accordance to one aspect of the present invention, select embodiments of the exemplary solid-state dosimeter system 1300, may comprise a front-end sensing/processing unit 1301 wherein the one or more radiation-sensitive MOSCAPs 1304 may be switchingly coupled to the capacitive readout IC 1306 across an active bias switching circuit 1330. The active bias switching circuit 1330 may alternate from applying an external bias 1332, for enhancing the radiation-induced build-up of positive charge (hole) density at the Si/SiO$_2$ interface, hence enhancing the capacitance response of the one or more radiation-sensitive MOSCAPs 1304, to removing the external bias 1332. The active bias switching circuit 1330 may also serve to connect the one or more radiation-sensitive MOSCAPs 1304 to the capacitive readout IC 1306 for performing a measurement of the radiation-induced capacitance response (shift in capacitance as a result of the radiation-induced buildup of oxide-trapped hole density at the Si/SiO$_2$ interface) generated by the one or more radiation-sensitive MOSCAPs 1304.

Accordingly, application of a positive bias voltage result in increased oxide trapped hole buildup near the Si/SiO$_2$ interface in an irradiated MOSCAP device. The number of oxide trapped holes near the Si/SiO$_2$ interface yields a negative shift in threshold voltage which appears as an effective equivalent increase in the positive voltage drop across the MOSCAP. In order to exploit the superior sensitivity and measurement resolution associated with capacitance measurement and readout electronics, the measurable capacitance response resulting from the radiation-induced shift in the threshold voltage may be used as a MOSCAP output response. However, MOSCAP capacitance response, when measured in the inversion operating region, exhibits no measurable response to radiation as can be seen from the exemplary post-radiation and pre-radiation C-V response curves 1400, measured for a p-substrate implemented radiation-sensitive MOSCAP in FIG. 14.

On the other hand, the capacitance in the depletion region (specifically in the vicinity of the inflection point 1402 on the C-V response curve) changes significantly. Therefore, in order to optimize measurement resolution, it is desirable to measure the capacitance of the radiation-sensitive MOSCAP in the depletion region of operation preferably at or near the inflection point 1402. The optimal measurement region is marked with a solid line 1404 in FIG. 14.

Figure 14:
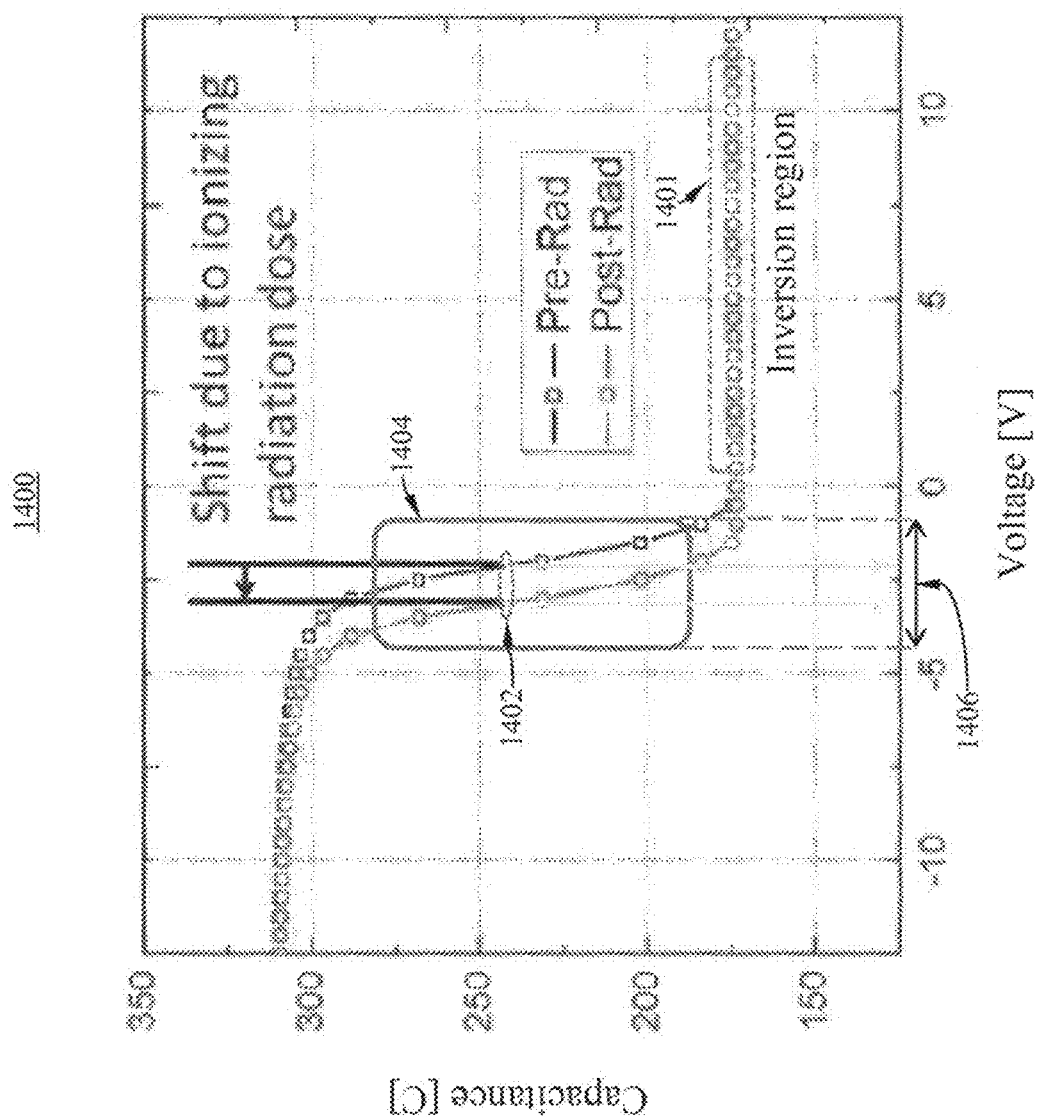
FIG. 14 is a graph illustrating the distinction between the radiation-sensitive MOSCAP operation regime during biasing operation and measurement operation to maximize sensitivity, according to one embodiment of the present invention. Integrated Circuit( )

In the case of the exemplary p-substrate implemented MOSCAP of FIG. 14, the application of a positive external bias to increase the rate and density of the radiation-induced hole build up near the Si/SiO$_2$ interface may place the MOSCAP in the inversion region 1401, as illustrated in FIG. 14. Measurement of the MOSCAP capacitance response induced by the radiation-induced charge buildup near Si/SiO$_2$ interface, post external bias application, may require shifting the operating point of the MOSCAP device into the depletion region prior to measuring the induced capacitance response.

Accordingly, in order to enable capacitance measurement within the optimal measurement region (depletion region) 1404, the voltage supply (Vdd) of the capacitive readout IC 1306 is chosen such that Vdd to ½(Vdd) voltage magnitude range falls within the depletion voltage range 1406 associated with the optimal measurement region (depletion region) 1402. In order to account for the negative polarity of the depletion voltage range 1406 in the optimal measurement region 1404, the measurement must be taken in a direction opposite to that of the bias application. The active bias switching circuit 1330 is configured accordingly to reverse the connection polarity of a p-substrate implemented radiation-sensitive MOSCAP between capacitance measurement and bias application such that biasing voltage is applied to the gate electrode of a p-substrate implemented radiation-sensitive MOSCAP while measurement is taken from the body (substrate) electrode of a p-substrate implemented radiation-sensitive MOSCAP.

Figure 15:
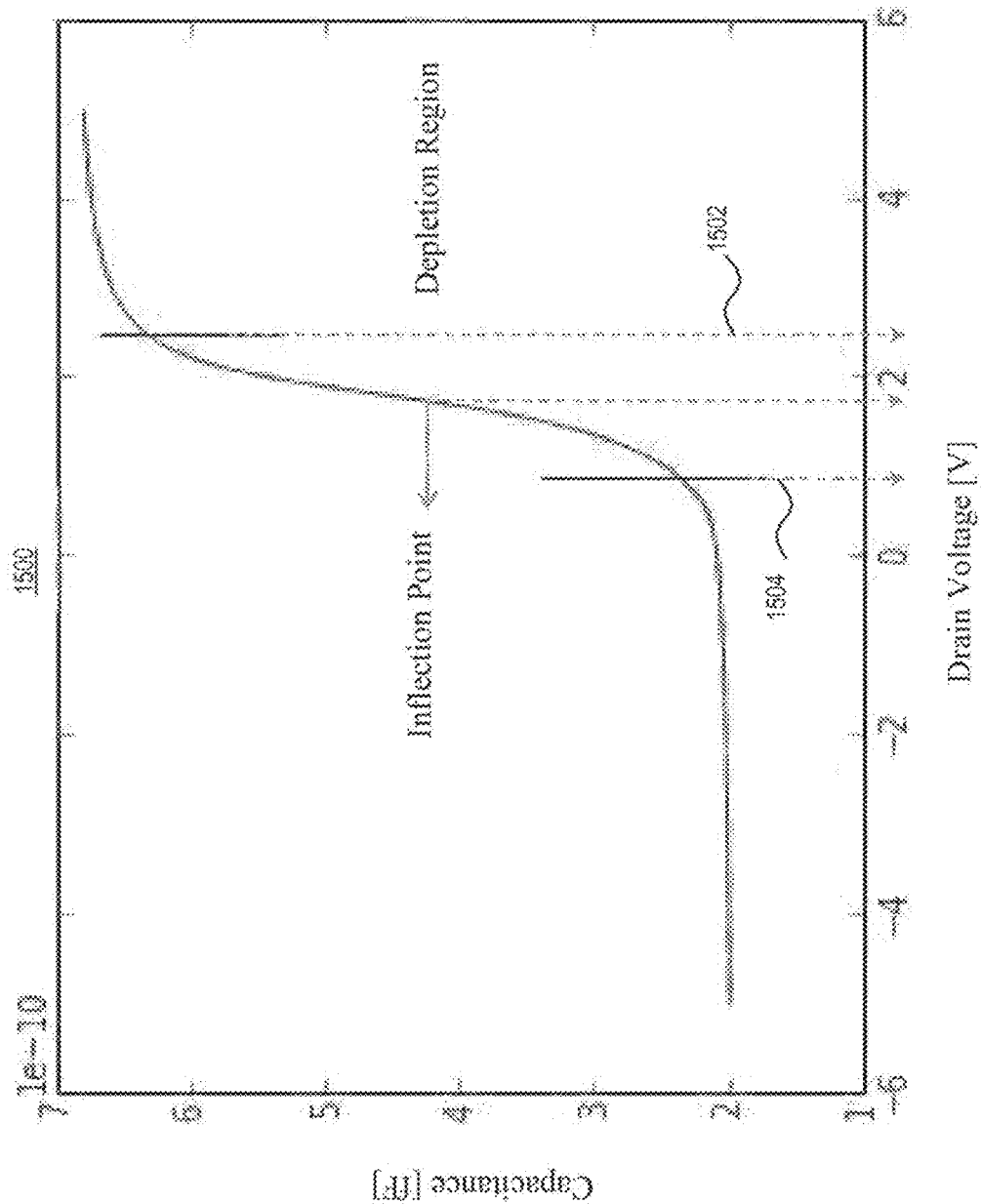
FIG. 15 is an illustration of the optimal capacitance-voltage response of the radiation-sensitive MOSCAP during capacitance measurement operation, according to one embodiment of the present invention.

The corresponding C-V trace 1500 associated with the measurement cycle is shown in FIG. 15. The depletion region, as shown on C-V trace 1500 is confined between the between the high-end voltage value 1502 and low-end voltage value 1504. The high-end voltage value 1502 corresponds approximately to the supply voltage (Vdd) of the capacitive readout IC 1306 and is selected as approximately 2.8 V in accordance to one embodiment of the present invention. The low-end voltage value 1504 corresponds to the threshold voltage ($V_{th}$) of the capacitive device (i.e. radiation-sensitive MOSCAP or reference capacitor) in accordance to one embodiment of the present invention.

Figure 16:
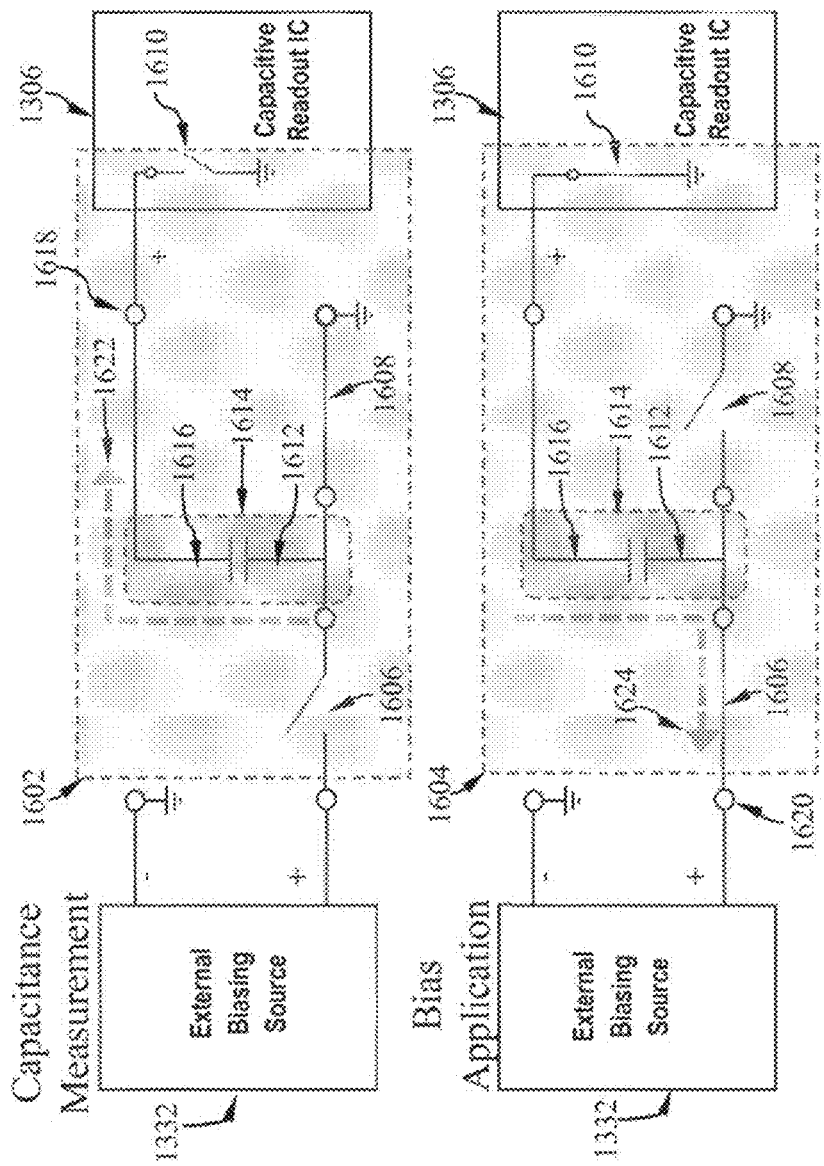
FIG. 16 is a schematic illustrating radiation-sensitive MOSCAP connectivity through the active biasing switch with capacitive readout IC and external bias source, according to one embodiment of the present invention.

FIG. 16 illustrate the connectivity pattern 1600 established by the active bias switching circuit 1330 during the capacitance measurement and bias application cycles. The connectivity pattern 1600 is characterized by a switching configuration 1602 and 1604 established by controlling the state of switches 1606, 1608 and 1610. In the switching configuration 1602, switch 1606 and 1610 are open while switch 1608 is closed thereby grounding the top conductive layer (gate) 1612 of the radiation-sensitive MOSCAP 1614 while connecting the bottom conductive layer (substrate/body) 1616 of the radiation-sensitive MOSCAP 1614 to the positive terminal 1618 of the capacitive readout IC 1306. In the switching configuration 1604, switch 1608 is open while switch 1606 and 1610 are closed thereby connecting the top conductive layer (gate) 1612 of the radiation-sensitive MOSCAP 1614 to the positive terminal 1620 of the external biasing source 1332 while grounding the bottom conductive layer 1616 of the radiation-sensitive MOSCAP 1614 through the capacitive measurement IC 1306. As illustrated in FIG. 16, the connection polarity during the capacitance measurement cycle as indicted by 1622 is opposite that of the bias application cycle as indicated by 1624.

Figure 17:
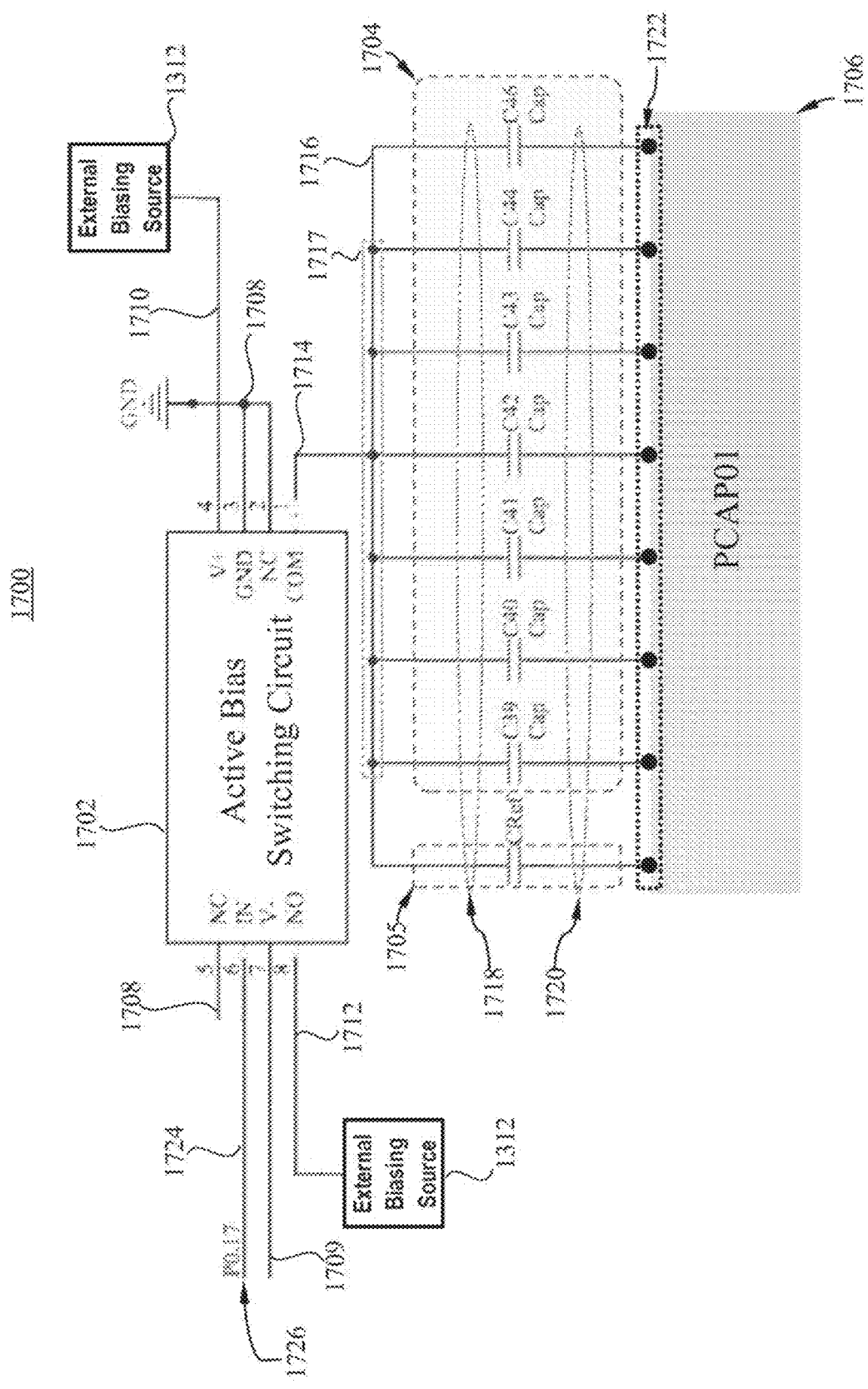
FIG. 17 is a basic block diagram illustration of an active biasing switch for coupling the radiation-sensitive MOSCAP alternately to the biasing and measurement nodes, according to one embodiment of the present invention.

FIG. 17 illustrates the connectivity profile 1700 between the active bias switching circuit 1702, one or more radiation-sensitive MOSCAPs 1704, reference capacitor 1705 and the capacitive readout IC represented by PCAP01 IC 1706. Active bias switching circuit 1702 comprises No-Connect ports 1708 that are left unconnected in one instance and tied to the ground terminal (GND) in another instance as illustrated in FIG. 17. Port 1709, designated for connection to a negative rail voltage, is also left unconnected according to the exemplary connectivity profile 1700. Furthermore, in the exemplary connectivity pattern 1700, port connection 1710 and 1712 are connected to the external biasing source 1312. Input/output port 1714 is connected to common node 1716 formed by shorting together the conducting contacts 1717 of the top conductive layers 1718 of the one or more radiation-sensitive MOSCAPs 1704. The bottom conductive layers 1720 of the one or more radiation-sensitive MOSCAPs 1704 are connected to the capacitive measurement ports 1722 of the capacitive readout IC (PCAP01 IC) 1706. Input port 1724 of the active bias switching circuit 1702 is connected to a digital output 1726 coming from microprocessor/wireless transceiver IC 1308.

Figure 18:
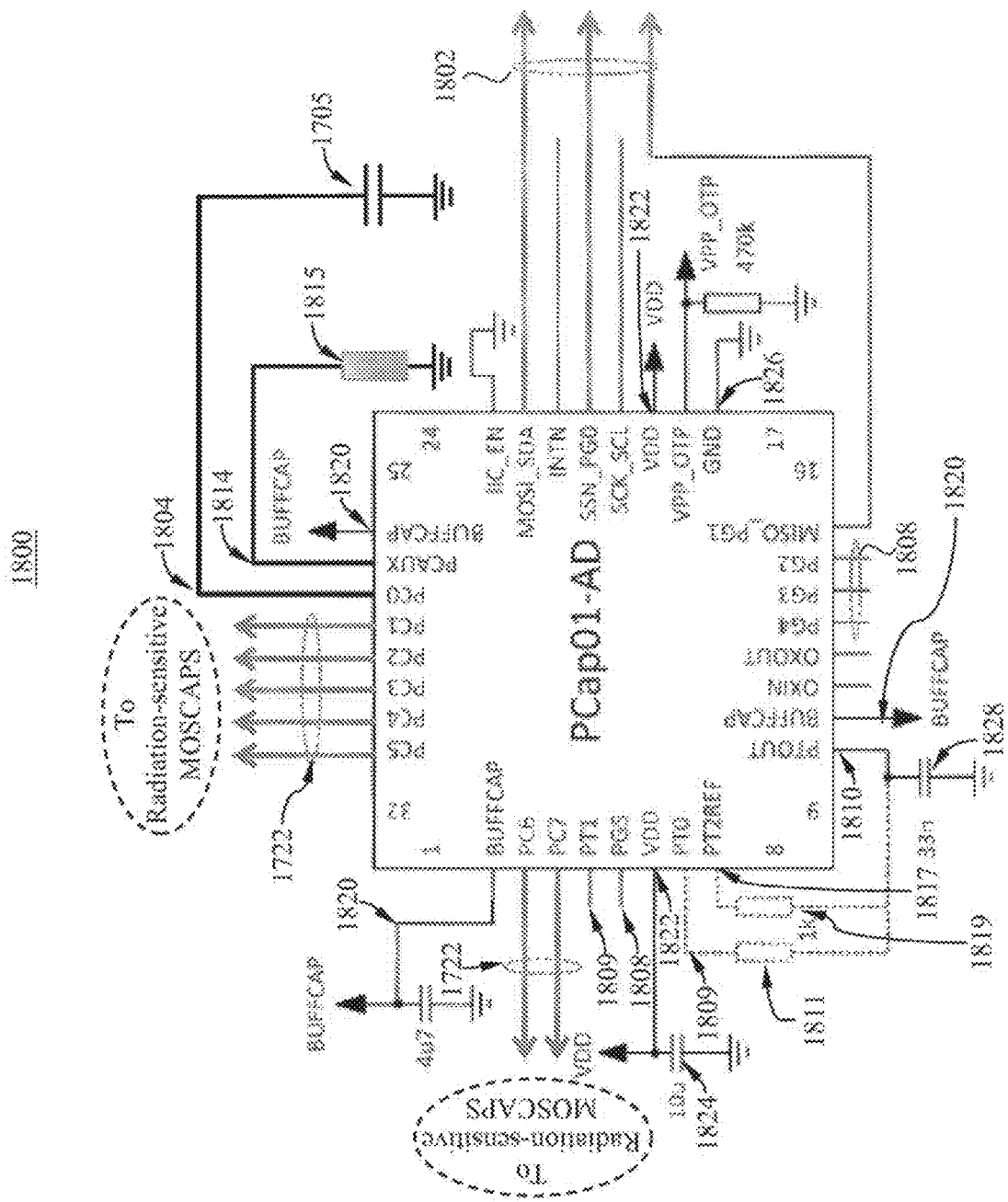
FIG. 18 is an illustration of an exemplary capacitance measurement and readout SoC comprising a Capacitance to Digital Converter IC, according to one embodiment of the present invention.

A select embodiment of the earlier described capacitive readout IC 1306 is illustrated in FIG. 18. Here, an application of the aforementioned capacitive readout IC 1306 is employed as a PCAP01 IC 1800. PCAP01 IC 1800 comprises capacitive measurement ports 1722 for connection to the one or more radiation-sensitive MOSCAPs 1704, capacitive output port 1802 for outputting a value for the radiation-induced capacitance response of the one or more radiation-sensitive MOSCAPs 1704, along with a temperature value that is outputted along with the capacitance data, port connection 1804 for connecting a reference capacitor 1705, general purpose input/output ports 1808, temperature measurement ports 1809 and 1810 for connecting an external resistive temperature sensor 1811, port connection 1814 for connecting an external discharge resistor 1815 and port connection 1817 for connecting an external temperature measurement reference sensor 1819, port connection 1820 for connecting, for example, to a bypass capacitor in order to protect the circuit against transient voltage fluctuations. Supply voltage (Vdd) connectivity is established through port connection 1822, with a bypass path to the ground provided by a bypass capacitor 1824, and ground connectivity is provided through port connection 1826. In the PCAP01 IC 1800 temperature measurement, similar to the capacitance measurement, is discharge time based. Therefore, an external capacitor 1828 may be connected to the external resistive temperature sensor 1811 as shown in FIG. 18.

Figure 19:
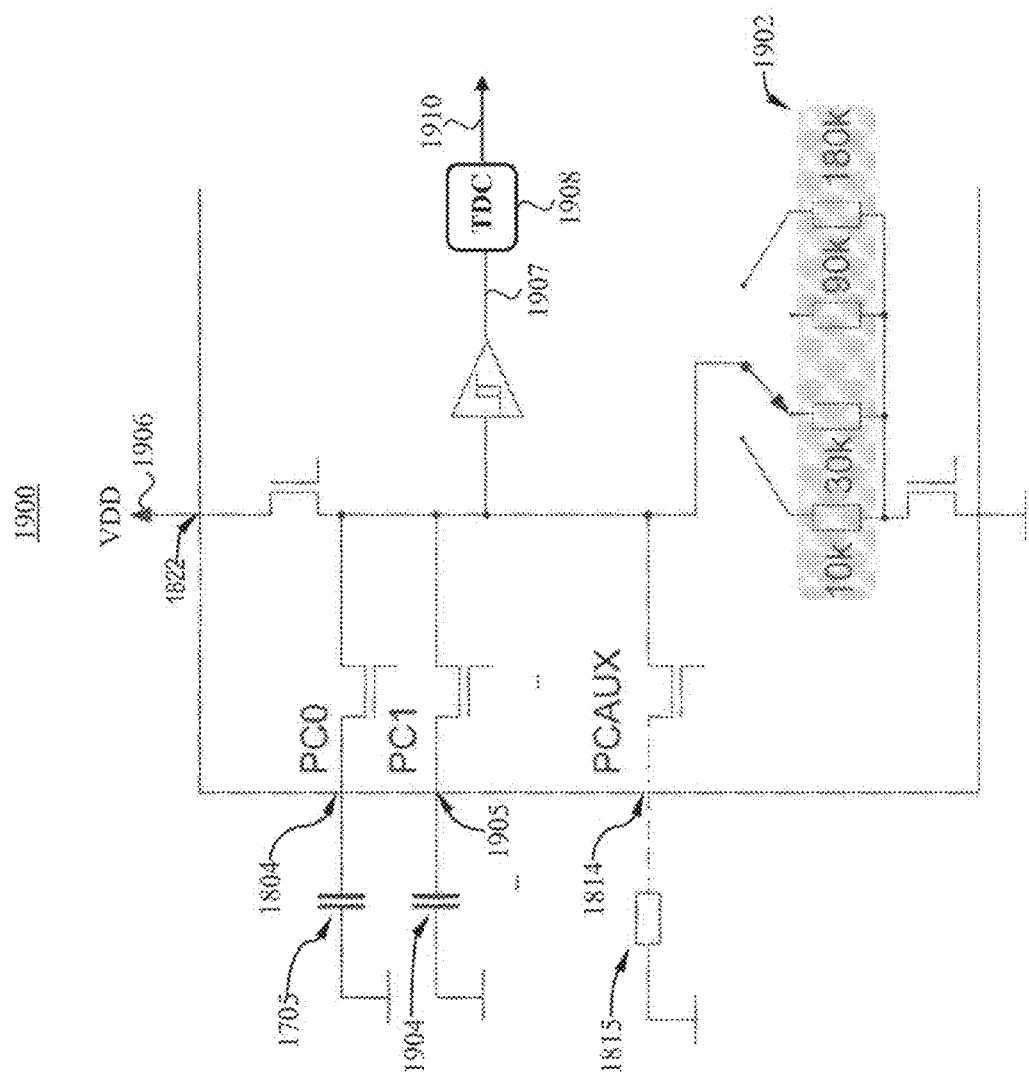
FIG. 19 illustrates an exemplary capacitance measurement schematic 1900, according to one embodiment of the present invention.

As stated above, the capacitance measurement method utilized by the PCAP01 IC 1800 is based on the measurement of the resistor-capacitor (RC) discharge time. The capacitors are represented by the radiation-sensitive MOSCAPs 1704 connected to ports 1722 in PCAP01 IC 1800. The resistors are represented by a set of four selectable internal discharge resistors 1902 with respective resistance values, for example, ranging from 10 kΩ to 180 kΩ, as illustrated by the exemplary capacitance measurement schematic 1900, in FIG. 19. The radiation-sensitive MOSCAP 1904, connected to the capacitive measurement port 1905, is charged to the supply voltage (Vdd) 1906 through port connection 1822, and subsequently discharged into a discharge resistor selected from the set of four selectable internal discharge resistors 1902. The radiation-induced MOSCAP 1904 may also be discharged into an external discharge resistor 1815 connected to port 1814. Since the set of four selectable internal discharge resistors 1902 and the external discharge resistor 1815 (in cases where an external discharge resistor functionality is supported) are of known values, based on the discharge time of the radiation-sensitive MOSCAP 1904 relative to the dis-charge time measured for the reference capacitor 1705 (which has a known capacitance value), radiation-induced capacitance response of the radiation-sensitive MOSCAP 1904 may be extracted. The measured discharge time value 1907 may be digitized with a Time-to-Digital Converter (TDC) 1908 to produce a digital output 1910 from which the radiation dose absorbed by the radiation-sensitive MOSCAP 1904 may be extracted.

Figure 20:
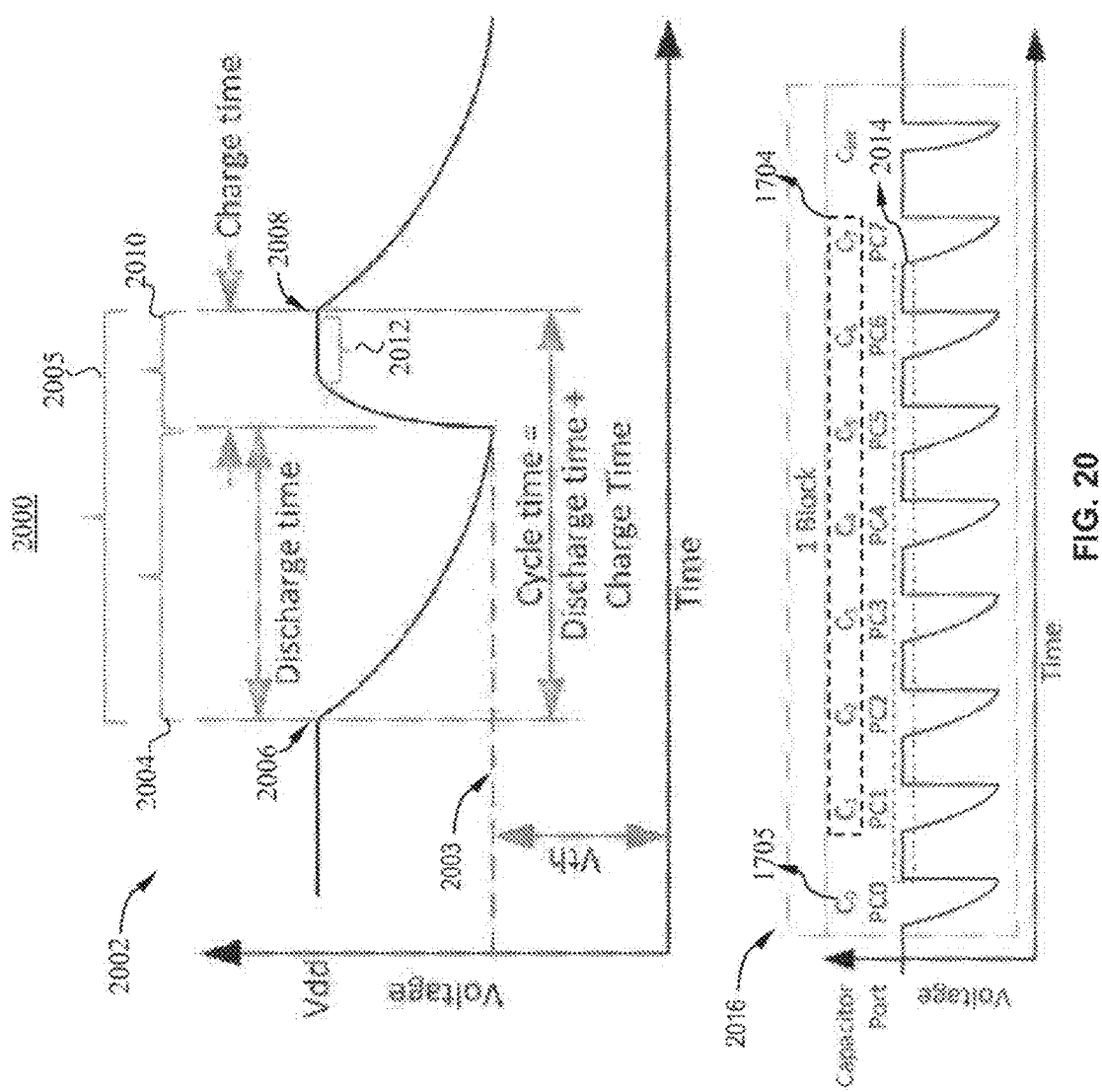
FIG. 20 illustrates an exemplary measurement block represented by a signal trace and a waveform, according to one embodiment of the present invention.

As previously described, the RC discharge time measurement comprises measurement of the time it takes for the voltage across a capacitive device (which may comprise a radiation-sensitive MOSCAP or a reference capacitor), that has been charged initially to, for example, the supply voltage (Vdd), to decrease from the Vdd level to a fraction of its initial value (corresponding to approximately one time constant). This is further demonstrated by the signal trace 2001 in the exemplary waveform illustration 2000 of FIG. 20. In FIG. 20, a capacitive device associated with the signal trace 2002 is discharged from its initial Vdd voltage level to a voltage level 2003, which corresponds to the threshold voltage ($V_{th}$) of the capacitive device, during the discharge time 2004. The total time between two consecutive discharge cycles may be defined as the cycle time. As illustrated by the signal trace 2002, a cycle time 2005, which may be set by the user, is the time interval between discharge cycles 2006 and 2008. In preferred embodiments of the present invention the cycle time 2005 may be equal to or greater than the sum of the discharge time 2004 and the charge time span 2010. In the exemplary signal trace 2002, the cycle time 2005 is greater than the sum of the discharge time 2004 and charge time 2010 by an over-head time interval 2012. In select embodiments of the present invention user-defined cycle time is selected to yield a positive over-head time interval, thus ensuring a discharge time measurement that is based on full discharge and charge cycles.

In accordance to one embodiment of the present invention, an exemplary measurement block represented by the signal trace 2016 in FIG. 20, comprises RC discharge time measurements for each capacitive element in a prescribed sequence associated with one or more radiation-sensitive MOSCAPs 1704 and the reference capacitor 1705. The PCAP 01 IC 1800 returns a discharge time, associated with a radiation-sensitive MOSCAP, that is normalized, for example, to a reference magnitude (i.e. the discharge time of the reference capacitor). Therefore the returned discharge time corresponds to a ratio of sensor (radiation-sensitive MOSCAP) discharge time ($\tau_{Sens}$) and the reference capacitor discharge time ($\tau_{Ref}$). As described above, in the select embodiment of the present invention the discharge time corresponds to a period of approximately one time constant ($\tau$). Considering that the ratio of the reference capacitance ($C_{Ref}$) and the sensor (radiation-sensitive MOSCAP) capacitance ($C_{Sens}$) is equal to the ratio of the respective time constants (as shown by equation 1), the capacitance value of the sensor (radiation-sensitive MOSCAP) can be represented by the expression in equation 2.

$$\frac{\tau_{Sens}}{\tau_{Ref}} = \frac{C_{Sens}}{C_{Ref}} \quad \text{(Equation 1)}$$

$$C_{Sens} = \frac{\tau_{Sens}}{\tau_{Ref}} C_{Ref} \quad \text{(Equation 2)}$$

In order to reduce measurement noise and enhance measurement resolution of the radiation-induced capacitance response, in accordance to one embodiment of the present invention, a prescribed number of discharge time measurement samples, for both the one or more radiation-sensitive MOSCAPs and the reference capacitor are obtained. The measured discharge time values, for both the one or more radiation-sensitive MOSCAPs and the reference capacitor, are averaged over a prescribed number of measurement samples and the averaged values are used to calculate the capacitance of the one or more radiation-sensitive MOSCAPs according to equation 1 The signal to Noise (SNR) of the measured discharge time data is proportional to the square root of the number of samples, hence averaging over a greater number of samples may enhance the measurement precision and resolution of the absorbed radiation dose in the one or more radiation-sensitive MOSCAPs.

Accordingly, by utilizing a MOSCAP to thereby produce a radiation-induced capacitance response with enhanced sensitivity by way of external biasing and optimization of MOSCAP fabrication and design parameters and furthermore by increasing the capacitance measurement precision (hence, the radiation measurement precision) by ensuring capacitance measurement in MOSCAP depletion region of operation (at or around the inflection point) and by implementing a measurement algorithm that utilizes averaging of measured capacitance values over a prescribed number of samples to reduce the measurement noise and enhance the measurement Signal-to-Noise (SNR) ratio, in accordance to the exemplary procedure and methodology described above, a high sensitivity, high resolution measurement of received radiation dose based on measurement of MOSCAP capacitance may be obtained. In accordance to one embodiment of the present invention, a twenty-fold increase in the relative measurement's precision, compared to C-V meter based capacitance measurements, is achieved with the disclosed capacitance measurement methodology.

Further improvement in accuracy and precision of capacitance measurement may be achieved by reduction of series resistance associated with the radiation-sensitive MOSCAP. Since measurement of MOSCAP capacitance response is performed in depletion, the series resistance of the device is dominated by the substrate resistance. A higher resistivity substrate may therefor give rise to higher signal power loss and hence results in a lower quality factor. Additionally, the exemplary capacitance readout circuit disclosed above uses RC discharge time with an external, temperature stable resistance for measurement of MOSCAP capacitance response. If the series resistance of the radiations-sensitive MOSCAP is large, this becomes part of the RC value. If the series resistance changes, the RC discharge time changes, and thus, the extracted capacitance value changes. As a result, series resistance may contribute to added environmental effects (resistance in semiconductors drifts with temperature). Therefore, by decreasing the series resistance the MOSCAP may be made into a purely (or primarily) capacitive device, so that small environmental drifts in the resistance are miniscule compared to the capacitance shift with dose. Therefore a heavily doped substrate with reduced series resistance may be preferable. The down-side of a heavily doped substrate however is the reduced breakdown voltage which makes the MOSCAP more susceptible to breakdown effect. Low-doped (higher resistivity) substrate on the other hand increase the breakdown voltage of the MOSCAP but also increase the series resistance thus degrading MOSCAP quality factor and noise performance. Current methods for reducing the series resistance primarily involve removing a portion of the silicon substrate (reducing the thickness of the silicon substrate) by polishing or etching the back of the silicon substrate.

Figure 21:
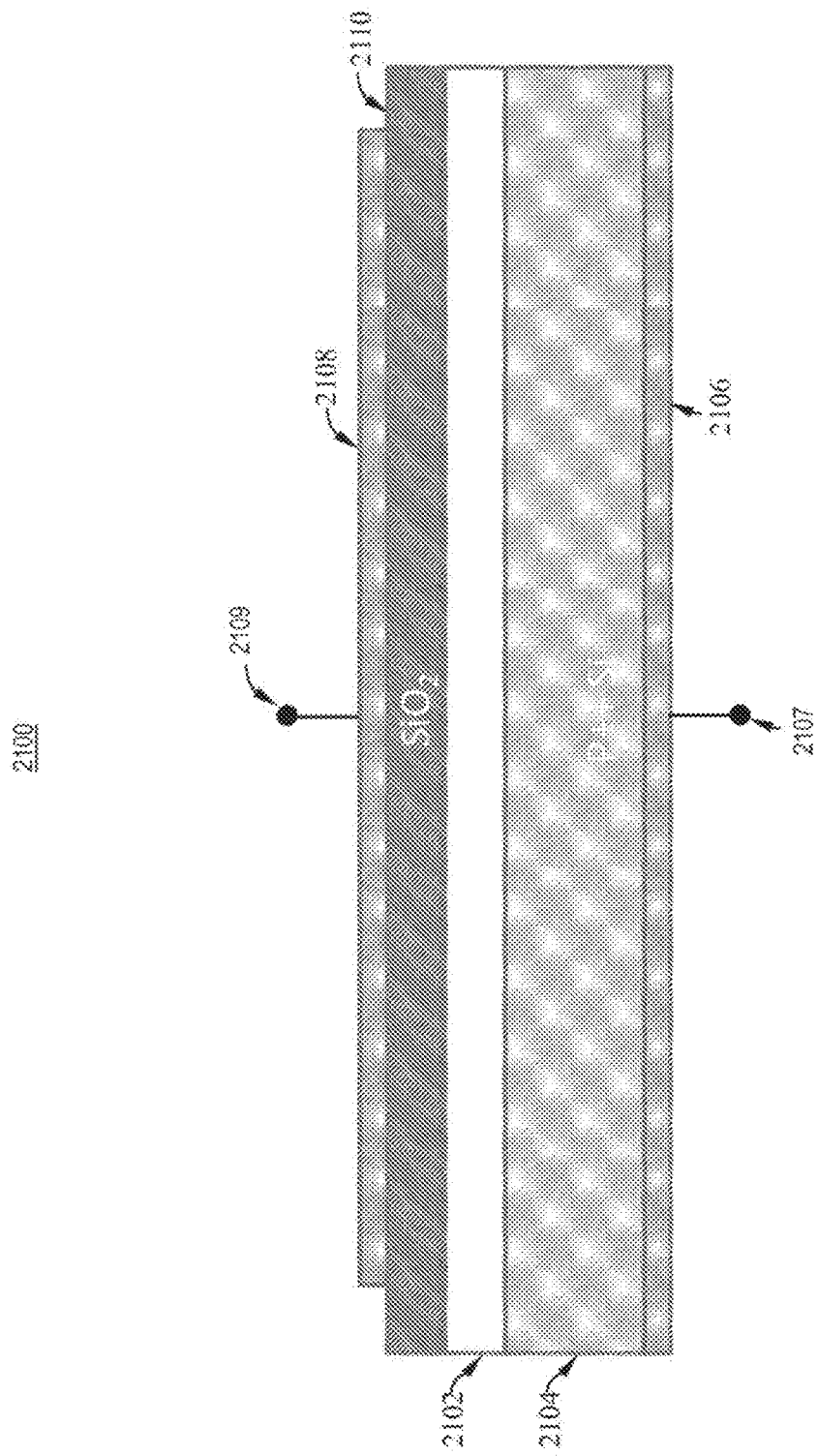
FIG. 21 is an illustration of an exemplary MOSCAP featuring a narrow low-doped epitaxial layer on top of a heavily doped starting substrate for reducing the series resistance of the device, thus improving the device quality factor.

FIG. 21 illustrate an exemplary MOSCAP structure 2100 with high breakdown voltage and high series resistance (lower reverse leakage current and high quality factor) using, a semiconductor over-layer such as a thin lightly-doped epitaxial semiconductor layer 2102 (with relatively high resistivity, low reverse leakage current and high breakdown voltage) with, for example, a p-type doping, disposed on top of heavily doped p-type starting semiconductor substrate 2104 with low resistivity. The heavily doped p-type substrate 2104 (lower electrode of the MOSCAP) may comprise a contact portion 2106 to which a terminal 2107 may be coupled to form the lower electrode connection of the exemplary MOSCAP structure 2100. The exemplary MOSCAP structure 2100 may further comprise a top conductive layer 2108 (upper electrode of the MOSCAP) to which a terminal 2109 may be coupled to form the upper electrode connection of the exemplary MOSCAP structure 2100. An insulating layer 2110 may be disposed between the thin lightly-doped epitaxial semiconductor layer 2102 and the top conductive layer 2108 to constitute a dielectric field layer (oxide layer) of the exemplary MOSCAP structure 2100. The dielectric field layer may be comprised of silicon oxide based compound such as silicon dioxide ($SiO_2$), silicon nitride or oxynitride. In a case of a radiation-sensitive MOSCAP, insulating layer 2110 may further comprise a radiation sensitive part of the exemplary MOSCAP structure 2100. In the exemplary MOSCAP structure 2100, the highly resistive thin lightly-doped epitaxial semiconductor layer 2102 results in high breakdown voltage while the low resistivity heavily doped-type p-type substrate 2104 results in low series resistance. The doping levels of the thin lightly-doped epitaxial semiconductor layer and the heavily doped starting substrate may be selected in accordance to the desired response characteristics of the respective MOSCAP.

In many application, in addition to accurate sensing of incident radiation, it may also be desirable to know the energy level a dose came from to aid in identifying the source. In other applications, such as occupational dosimetry, it may further be required to configure, adapt or process the sensor radiation response in such a way as to emulate the way biological tissue responds or receives radiation. These requirement are typically addressed through the Use of filters disposed over MOSCAP sensors. Using a set of filters it may be possible to approximate the way biological tissue may respond to or receive incident radiation by, for example, selectively attenuating the energy of incident photons by a prescribed amount, before the radiations impinges upon MOSCAP radiation-sensitive portion. Furthermore, by using a configuration of three sensors covered by respective filters having different (known) energy-dependent coefficients, the energy level of incident radiation can be determined with reasonable certainty. However, since filter absorption or transmission coefficient are always either equal to or less than one, the signal of interest will be attenuated on the process. This may decrease minimum resolvable dose (sensitivity).

In accordance to one aspect of the present invention, instead of using external filters, the composition material comprising the gate terminal of a MOSCAP sensor is chosen accordingly to alter the radiation response of the MOSCAP sensor. This has the significant advantage of enhancing the radiation response of MOSCAP at lower incident energies, when a high atomic number composition material (high Z-value) is selected as substitute for material that will be placed close to the oxide (i.e. the gate), while leaving the response un-attenuated at higher incident energies.

Figure 22:
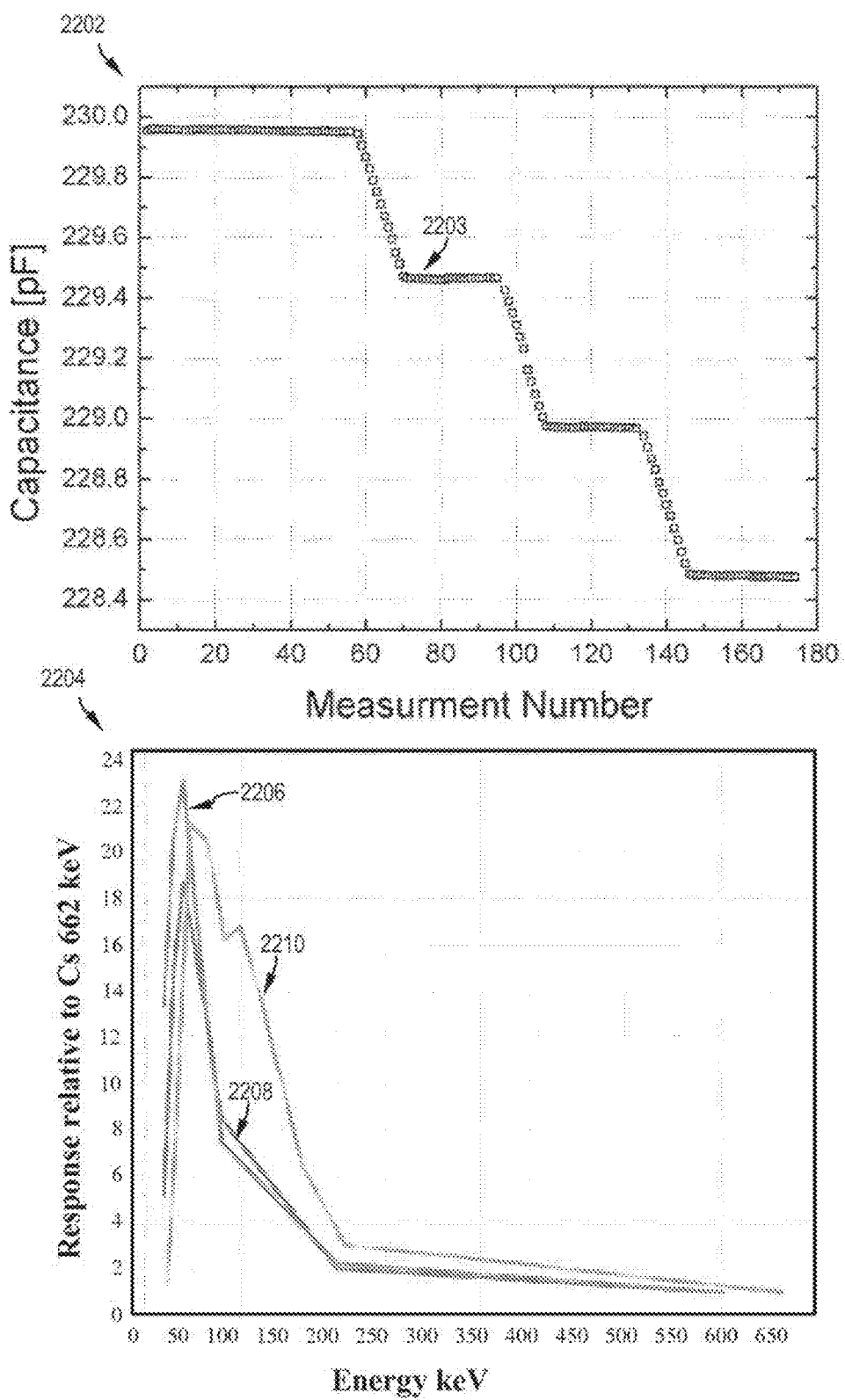
FIG. 22 is an illustration of an radiation response using high atomic number gate material, such as Gold, for gate terminal of a MOSCAP.

The measurement trace 2202 in FIG. 22, represents a radiation-induced capacitance response 2203, measured from an externally un-biased, un-optimized MOSCAP sensor with gate terminal comprising of High-Z composition material, such as, for example, Gold (Au). The capacitance shift observed in waveform trace 2203 due to absorbed x-ray radiation dose is over 10 times the expected amount. The augmented capacitance response is due to additional secondary electrons created by the x-ray passing through the high-Z gate material. This effect is further demonstrated in the illustration 2204 representing trace waveforms 2206, 2208 and 2210

Trace waveforms 2206 and 2208, represent simulated response, using a mono-energetic beam stimuli, of an exemplary MOSCAP sensor having gate terminal comprising of gold-based (High-Z) material AU-OW and AU-PL, respectively. The simulation Trace waveform 2210 represents a measured radiation response of an exemplary MOSCAP with a gold-based gate terminal and 4.8 mm plastic-based radiation-sensitive dielectric layer, to an ISO narrow x-ray beam. As may be observed from illustration 2204, the measured result 2210 agree with simulation results 2206 and 2208. In both the simulated and measured results, illustrated in 2204, the enhanced radiation-induced capacitance response for an exemplary MOSCAP with High-Z material based gate terminal is clearly observable at lower photon energies.

Therefore in accordance to one aspect of the present invention a method and apparatus is disclosed based on utilizing a set of at least three MOSCAP radiation sensors having multiple gate terminals comprised of different gate composition materials having different atomic number (different levels of radiation sensitivity) in such a way as to differentially alter the radiation response across multiple gate terminal (producing a plurality of differentially-enhanced radiation-induced response signals depending on the energy of incident radiation and the respective atomic numbers for the different gate composition materials) to therefore enable tissue equivalent radiation response extraction and/or radiations source identification/differentiation.

The disclosed embodiments improve minimum resolvable dose for lower energy radiation photons, such as, for example, x-rays and low-energy gammas (high-energy gammas will remain the same), and allow for a radiation response that can distinguish the energy level of the incident radiation photon, for example by distinguishing a low energy radiation source from a high energy radiation source. Determining the energy of the radiation source also allows the most probable energy source to be determined. Examples of algorithms that may be used to calculate the absorbed dose, according to various embodiments of the present invention, are described in U.S. Pat. No. 8,803,089 to Walerow et al., U.S. Pat. No. 9,057,786 to Walerow et al. and U.S. Pat. No. 9,063,235 to Walerow et al., the entire contents and disclosure of which are incorporated herein by reference. The disclosed exemplary method and apparatus may be used as an alternative to using filter material which will attenuate the signal and degrade device form factor.

An exemplary selection of different gate composition material, based on fabrication availability, are loosely designated within low atomic number composition material (Low-Z), middle or medium atomic number composition material (Mid-Z) and high atomic number composition material (High-Z) categories, and illustrated in a material Table 1, shown in FIG. 29.

In accordance to one aspect of the present invention, the achieved precision in distinguishing between low energy and high energy incident radiation and quality of obtained tissue equivalent radiation response may be improved by using composition materials with wide separation among their respective atomic numbers. In one embodiment of the present invention, different gate composition material comprise of Aluminum (Al), Molybdenum (Mo) and Gold (Au) as Low-Z, Mid-Z and High-Z gate material respectively. In another embodiment of the present invention, in order to bring the exemplary structure and implementation methodology into compatibility with the standard CMOS process, different gate composition materials for the plurality of gate terminals may comprise of Poly-Silicon (Poly-Si), Copper (Cu) and Tungsten (W) as Low-Z, Mid-Z and High-Z gate material, respectively.

Figure 23:
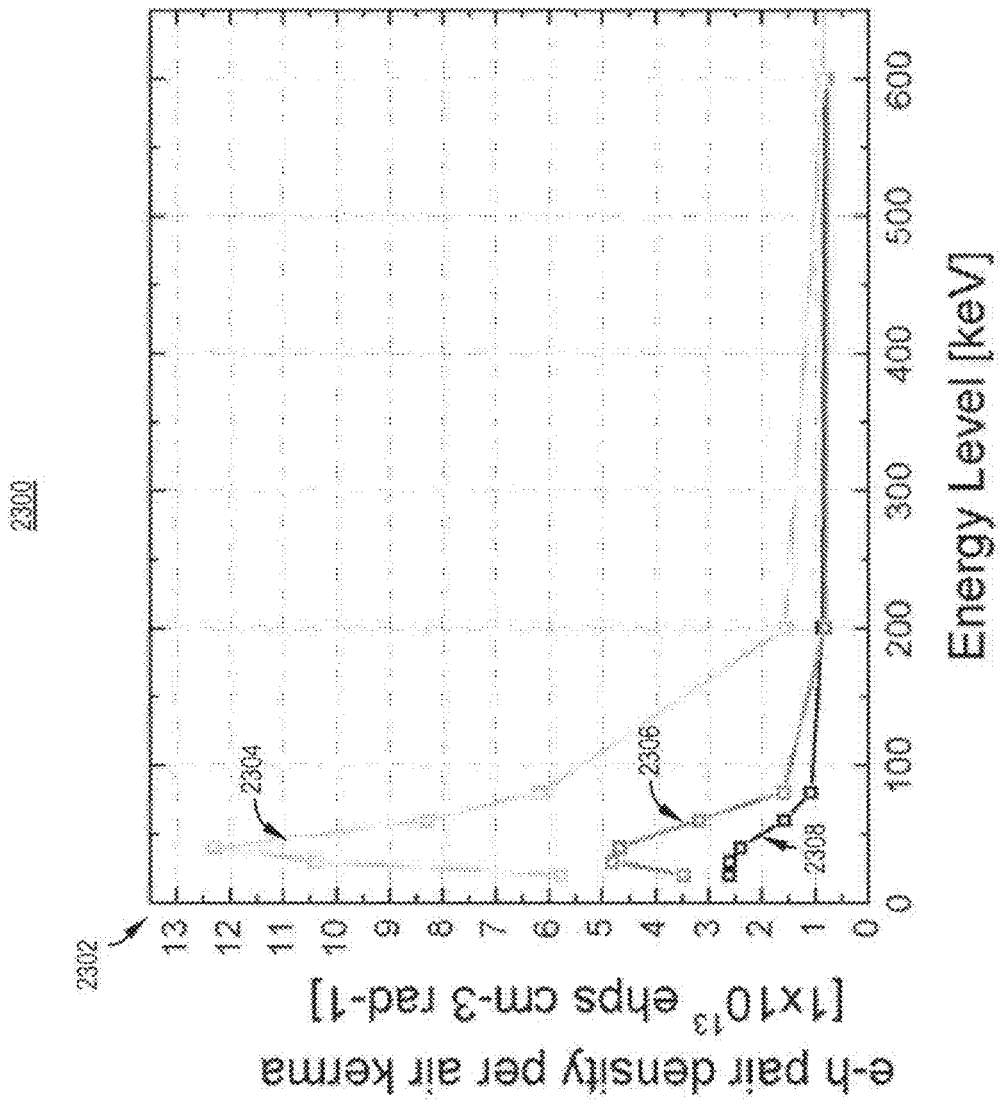
FIG. 23 is an illustration of an radiation sensitivity in terms of generated e-h pair density as a function of incident radiation photon energy for three different gate material. to absorption of radiation with increasing photon energy exemplary MOSCAP structure with multiple gate electrode design for variable radiation response functionality.

Measurement 2302, illustrated in FIG. 23 represent the radiation-induced electron-hole (e-h) pair density as a function of absorbed energy level, measured for MOSCAPs with gate terminals comprising of different composition materials with different atomic number, such as, for example, Silicon (Si), Copper (Cu) and Tungsten (W), in accordance to one aspect of the present invention. In the exemplary measurement 2302, waveform 2304 represent the radiation response of High-Z material corresponding to Tungsten-based gate terminal, waveform 2306 represent the radiation response of Mid-Z gate material corresponding to Copper-based gate terminal, waveform 2308 represent the radiation response of Low-Z gate material corresponding to Poly-silicon gate. The observable difference in the radiation-induced response is attributable to different gate composition materials atomic numbers, corresponding to Low-Z, Mid-Z and High-Z material characteristics. The measured values of radiation-induced e-h pair density generated within unit volume ($cm^3$) of corresponding gate material type, for exemplary Low-Z, Mid-Z and High-Z material, in accordance to one embodiment of the present invention is shown as follow:

TABLE 2

| Energy | Electron hole pair density per air Kerma [ehps cm−3 rad−1] | | |
|---|---|---|---|
| [keV] | Si gate | W gate | Cu gate |
| 20 | 2.61E+13 | 5.81E+13 | 3.48E+13 |
| 30 | 2.60E+13 | 1.04E+14 | 4.81E+13 |
| 40 | 2.40E+13 | 1.23E+14 | 4.68E+13 |
| 60 | 1.58E+13 | 8.32E+13 | 3.20E+13 |
| 80 | 1.08E+13 | 6.17E+13 | 1.59E+13 |
| 200 | 8.60E+12 | 1.55E+13 | 8.11E+12 |
| 600 | 8.17E+12 | 8.34E+12 | 7.76E+12 |
| Co60 | 8.21 + 12 | 8.14E+12 | 7.87 + 12 |

As mentioned, the additional e-h pairs created in the high-z material, enhances the radiation response measured from the respective gate terminal. However, this is an energy-dependent property, therefore in a multi-gate MOSCAP radiation sensor if a High-Z gate terminal produces a larger response relative to gate terminal comprising lower-Z material, the dose may be attributed to a lower energy ionizing radiation such as, for example, an x-ray. Alternatively, if the response measured is approximately same for all the gate terminals, the dose may be attributed to higher energy ionizing radiation such as, for example, a high-energy gamma ray. In accordance to one embodiment of the present invention, the multi-gate MOSCAP sensor (having a plurality of gate terminals) comprising at least three gate terminal may be fabricated on a common substrate in a single chip. In accordance to another embodiment of the present invention, the device may be implemented as three separate MOSCAP sensors packaged together, or alternatively, since no external filters would be required filters, they may be implemented on a same substrate in a single chip, with three respective gate connections. This simplifies integration on the PCB and saves space, along with minimizing parasitic capacitance and location-dependent sources of error (i.e., one sensor is slightly closer to a heat source, like the microcontroller). In some embodiment of the present invention gate thicknesses may range from approximately 20 nm to approximately 1000 nm with a typical value in an approximate range of 100 nm to 300 nm.

Figure 24:
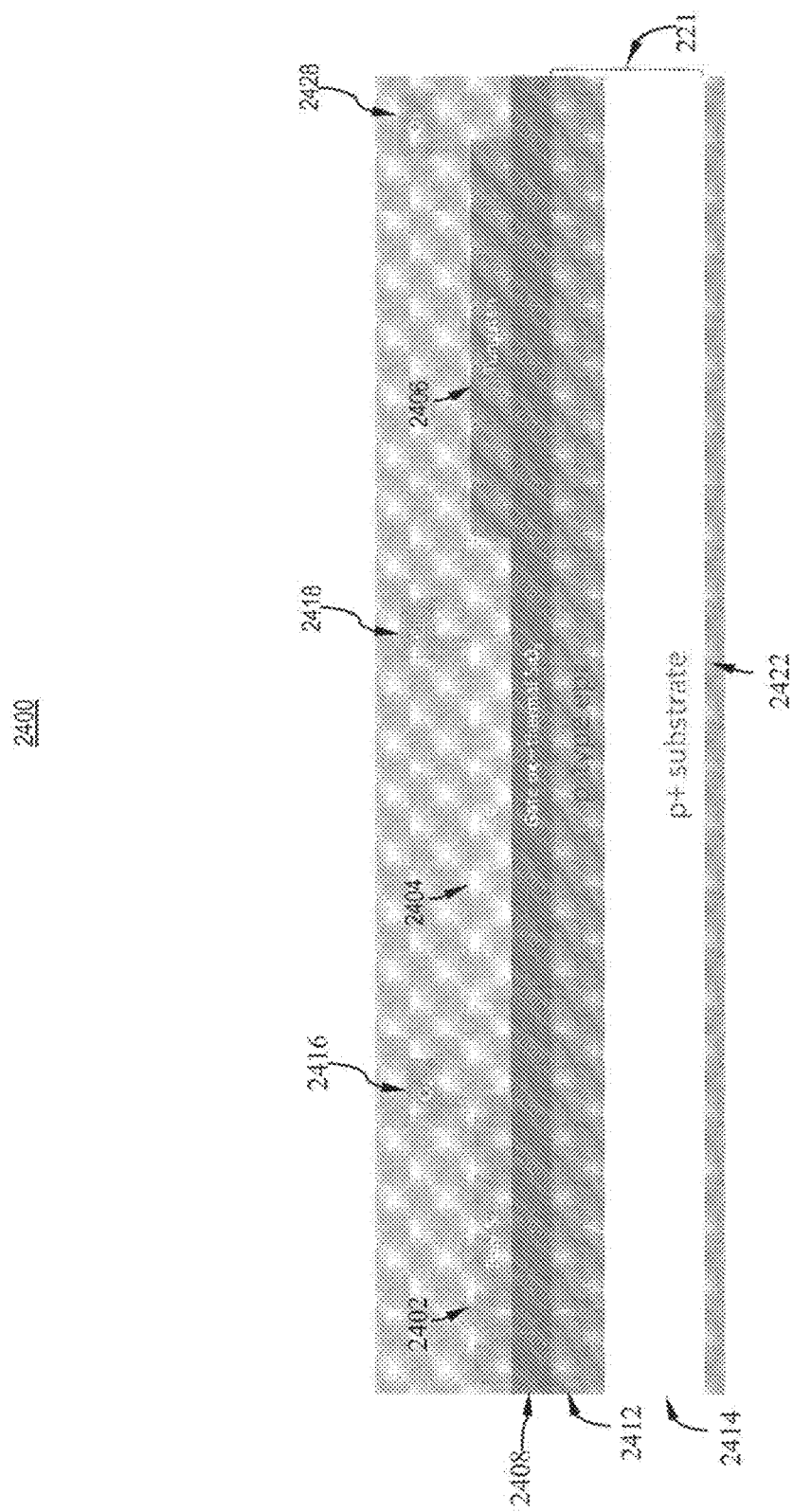
FIG. 24 is an illustration of an exemplary MOSCAP structure with multiple gate electrode design for variable radiation response functionality.

FIG. 24 represents a cross-sectional illustration of an exemplary MOSCAP structure 2400 utilizing a multi-gate configuration to produce plurality of differentially-enhanced radiation-induced signals capable of differentiating radiation sources based on incident photon energy and producing a tissue equivalent radiation response. The exemplary MOSCAP structure 2400, illustrated in FIG. 24 comprises three gate terminal 2402, 2404 and 2406 comprising respectively of Low-Z poly-silicon material, Mid-Z Copper material and High-Z Tungsten material, in accordance to one embodiment of the present invention. Gate terminals 2402,

2404 and 2406 are adjacently disposed in a non-contacting pattern on top of a dielectric layer 2408. The dielectric layer 2408 may be disposed over a bottom substrate layer 2410 comprising the lower terminal of the exemplary MOSCAP structure 2400. The bottom substrate layer 2410 may be comprised of a stacked configuration of an epitaxial layer 2412 disposed on top of a base substrate layer 2414. In accordance to one embodiment of the present invention the base substrate may have a greater doping concentration, but the same doping polarity as epitaxial layer 2412. In another embodiment of the present invention the base substrate comprises a heavily doped p-type material relative to a lightly-doped epitaxial layer. The exemplary MOSCAP structure 2400 may further comprise upper conducting contacts 2416, 2418 and 2420 receptively coupled to gate terminal 2402, 2404 and 2406 and a lower conducting contact 2422 coupled to base substrate layer 2414.

Figure 25:
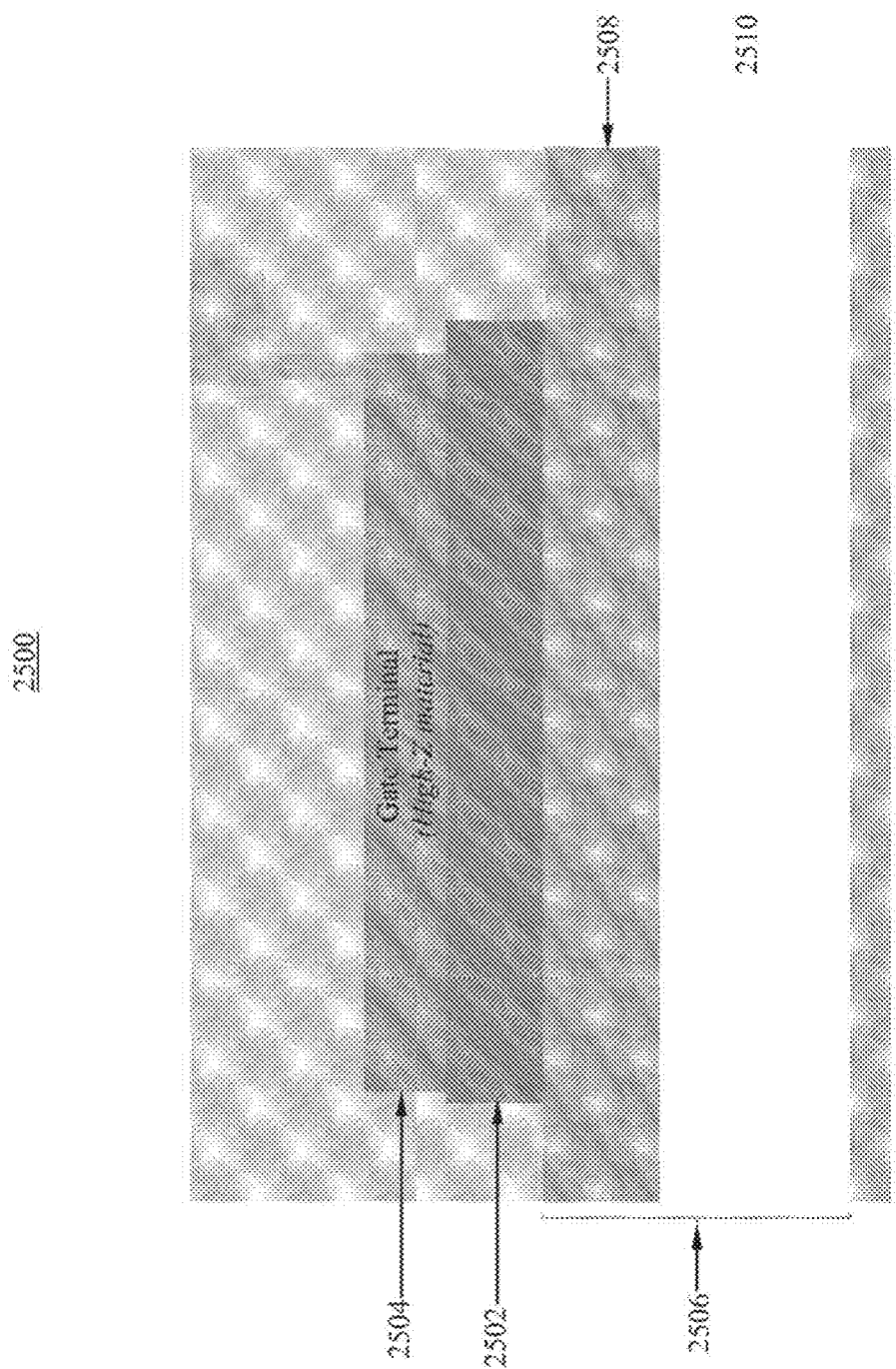
FIG. 25 is an illustration of an exemplary MOSCAP structure with gate terminal composed of high atomic number material for enhanced radiation sensitivity.

FIG. 25 illustrates a cross-sectional view of an exemplary single-gate MOSCAP structure 2500, in accordance to one embodiment of the present invention. MOSCAP structure 2500 may comprise a radiation-sensitive dielectric layer 2502 interposed between a upper gate terminal 2504, composed of high-Z material, and a lower substrate terminal 2506, which may further comprise an epitaxial layer 2508 stacked on top of a base substrate layer 2510. In the exemplary MOSCAP structure 2500, radiation-sensitive dielectric layer 2502 may not be the only radiation-sensitive component of the MOSCAP. Additional electron-holes pairs generated in the high-Z material of the gate terminal 2504 in response to low-energy incident radiation add to the low-energy radiation sensitivity of the device and enhances the overall performance of the MOSCAP radiation sensor in lower-energy sensing regime as X-ray detection.

In one embodiment of the present invention, it is possible to achieve amplification of the radiation-induced signal at x-ray energies using a high-Z gate material in a MOSCAP structure. For example, using a high-Z gate material in a MOSCAP structure according to one embodiment of the present invention may produce a factor of 10 improvement in x-ray sensitivity. In contrast, many current methods of energy discrimination attenuate a radiation-induced signal to achieve discrimination.

Figure 26:
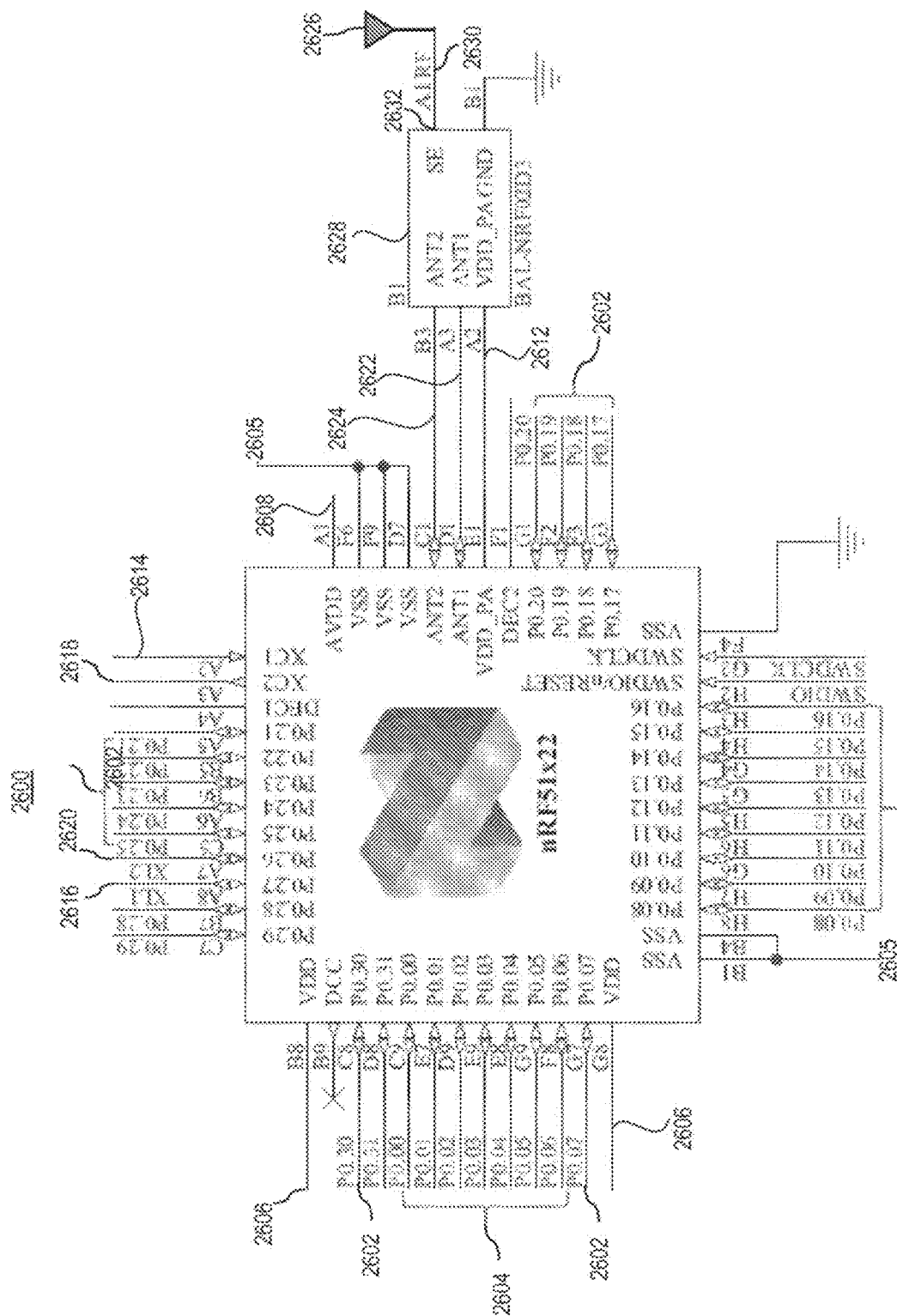
FIG. 26 is an illustration of an exemplary microprocessor/wireless transceiver integrated circuit (IC) utilized for storage, processing and wireless transmission of radiation-sensitive MOSCAP sensor data, according to one embodiment of the present invention.

A select embodiment of the earlier described microprocessor/wireless transceiver IC 1308 is illustrated in FIG. 26. Here, an application of the aforementioned microprocessor/wireless transceiver IC 1308 is employed as a Nordic nRF51422 SoC IC 2600. Nordic nRF51422 SoC IC 2600 comprises a set of digital input/output (I/O) ports 2602, a set of ports 2604 that can support both digital Input/output (I/O) and analog input function, ground connectivity ports 2605, Vdd power supply connectivity ports 2606, analog power supply connectivity ports 2608 for RF functionality, output power supply port 2612 for providing supply voltage for on-chip RF power amplification, analog input ports 2614 and 2616 for high and low frequency reference clock input connectivity, analog output port 2618 and 2620 for high and low frequency reference clock output connectivity, RF ports 2622, 2624 for differential transmit and receive (TX and RX) connectivity to an on-board antenna transceiver 2626 through an antenna matching circuitry 2628. The outgoing RF signal 2630 on port 2632 of the antenna matching circuitry 2628 is sent to the on-board antenna transceiver 2626 for wireless transmission to a local/remote system.

In one embodiment, a Nordic S310 Bluetooth® 4.0 Soft-Device (protocol stack) is implemented in conjunction with radio hardware such as, for example, the antenna transceiver 1310 for providing wireless connectivity and communication functionality between the front-end sensing/processing unit 1301 and the far-end processing/reporting unit or base station 1302.

In one embodiment, the microprocessor/wireless transceiver IC 1308 may be used to process and average some of the data from the capacitive readout IC 1306, and to store the averaged value. In the disclosed embodiment, when a user is close to a far-end processing/reporting unit or base station 1302, a Bluetooth® link, using the Nordic S310 Bluetooth® 4.0 protocol stack is established between the front-end sensing/processing unit 1301 and the base station 1302 and the generated environmental sensing data (i.e. absorbed radiation dose and temperature and acceleration related data) are uploaded to the base station 1302. The number of readings taken by the front-end sensing/processing unit 1301 per day and the number of readings transmitted to the base station 1302 are programmable. These are application-dependent with the primary tradeoff of frequent sampling being the relatively-large power consumption of the wireless transmission compared to the rest of the system.

Figure 27:
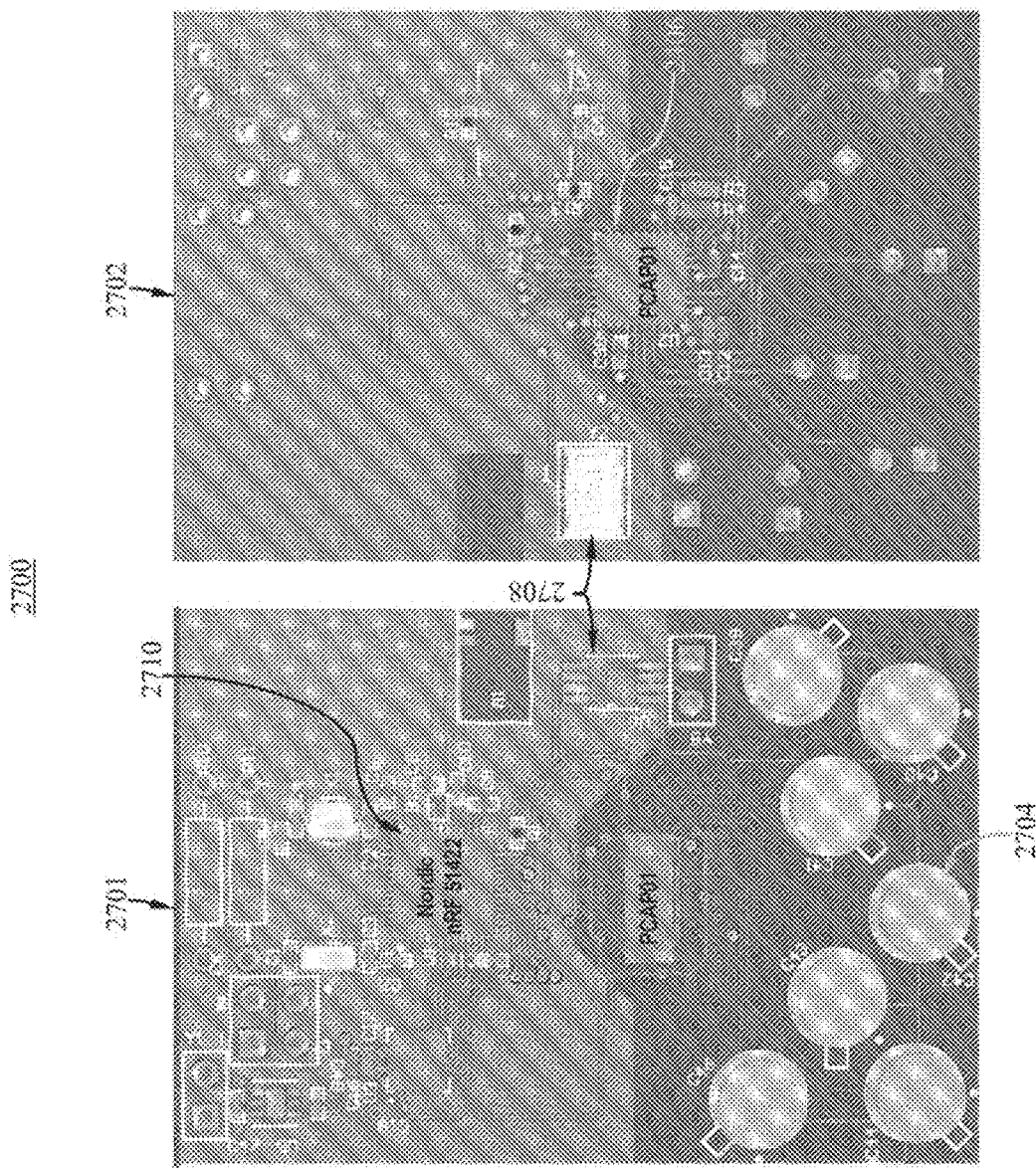
FIG. 27 is a CAD image of the front-end sensing/processing unit of the solid-state dosimeter system, according to one embodiment of the present invention.

FIG. 27 represents a CAD image of the front-end sensing/processing unit 1301 of the solid-state dosimeter system 1300, in accordance to one embodiment of the present invention. The system 1301 is implemented on an exemplary double-sided Printed Circuit Board (PCB) 2700, having a front side 2701 and a back side 2702. The exemplary PCB 2700 comprises: one or more radiation-sensitive MOSCAPs sensors 2704 for producing a capacitance response in proportion to the absorbed radiation dose; a capacitive readout IC, represented by the PCAP 01 IC 2706, for electronic measurement and digitization of the radiation-induced capacitance response of the one or more radiation-sensitive MOSCAP sensors 2704; an active bias switching circuit 2708 for alternately coupling the one or more radiation-sensitive MOSCAP sensors 2704 to a biasing source and to the PCAP 01 IC 2706; a microprocessor/wireless transceiver IC, represented by a Nordic nRf 51422 IC 2710, for processing, storage and wireless transmission of measured environmental data (i.e. radiation dose, temperature and acceleration) with additional real-estate designated for peripheral modules such as temperature sensor and accelerometer, in accordance to one embodiment of the present invention. In one embodiment, the radiation-sensitive MOSCAP sensors are packaged in TO-46 enclosures. The capacitance voltage curves of the sensors are measured to ensure proper operation and inflection voltage. In one embodiment of the present invention all components and sensors are populated on a PCB of about 20 mm×50 mm. In accordance to one embodiment of the present invention, the on-board microprocessor/transceiver IC such as, for example, the Nordic nRF 51422 2710, may be responsible for the storage, processing and wireless transmission to a local/remote base station of the environmental data produced by one or more on-board sensors such as, for example, the one or more radiation-sensitive MOSCAPs 2704 and electronically measured and represented by an on-board capacitive readout IC such as, for example, the PCAP01 IC 2706. The firmware may be flashed to the microprocessor with, for example, read rates and data storage information.

Figure 28:
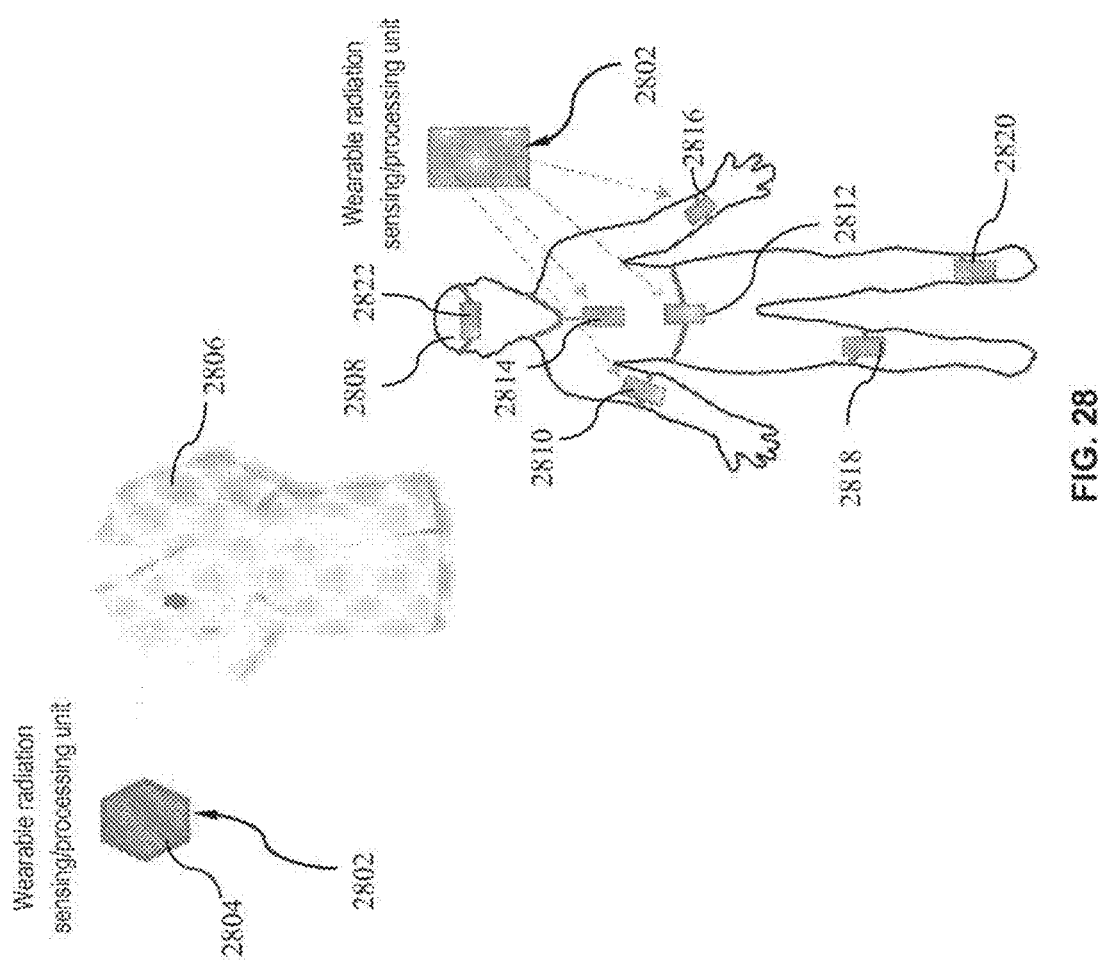
FIG. 28 illustrates exemplary applications of wearable devices, according to embodiments of the present invention.

As discussed earlier above with respect to FIG. 13, disclosed embodiments for occupational dosimetry applications may include front-end sensing/processing unit 1301 of solid-state dosimeter system 1300 implemented as a portable or wearable device. Exemplary applications of wearable devices are illustrated in FIG. 28. Thus, in one embodiment, the disclosed front-end sensing/processing unit 1301 of solid-state dosimeter system 1300 is implemented within wearable device 2802 shown as a badge 2804 affixed to a user's garment 2806. In other embodiments, wearable device 2802 may be implemented and configured to be worn by a user 2808, for example, at or around various extremities such as the arm 2810, the waist 2812, the neck 2814, the wrist 2816, the leg 2818, ankle 2820 and/or head 2822. Thus, disclosed embodiments provide that the wearable device may be mounted, fastened or attached to a user or any part of a user's clothing, or incorporated into items of clothing and accessories which may be worn on the body of a user. Wearable device 2802 may include wearable technology, wearables, fashionable technology, tech togs, fashion electronics, clothing and accessories, such as badges, watches, and jewelry incorporating computer and advanced electronic technologies.

The system, as described in the present technique or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps that constitute the method of the present technique.

The computer system comprises a computer, an input device, a display unit and/or the Internet. The computer further comprises a microprocessor. The microprocessor is connected to a communication bus. The computer also includes a memory. The memory may include Random Access Memory (RAM) and Read Only Memory (ROM). The computer system further comprises a storage device. The storage device can be a hard disk drive or a removable storage drive such as a floppy disk drive, optical disk drive, etc. The storage device can also be other similar means for loading computer programs or other instructions into the computer system. The computer system also includes a communication unit. The communication unit allows the computer to connect to other databases and the Internet through an I/O interface. The communication unit allows the transfer as well as reception of data from other databases. The communication unit may include a modem, an Ethernet card, or any similar device which enables the computer system to connect to databases and networks such as LAN, MAN, WAN and the Internet. The computer system facilitates inputs from a user through input device, accessible to the system through I/O interface.

The computer system executes a set of instructions that are stored in one or more storage elements, in order to process input data. The storage elements may also hold data or other information as desired. The storage element may be in the form of an information source or a physical memory element present in the processing machine.

The set of instructions may include various commands that instruct the processing machine to perform specific tasks such as the steps that constitute the method of the present technique. The set of instructions may be in the form of a software program. Further, the software may be in the form of a collection of separate programs, a program module with a larger program or a portion of a program module, as in the present technique. The software may also include modular programming in the form of object-oriented programming. The processing of input data by the processing machine may be in response to user commands, results of previous processing or a request made by another processing machine.

Having described the many embodiments of the present invention in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

What is claimed is:

1. A method of determining the energy of incident radiation, the method comprising:
    comparing a plurality of signals induced by the incident ionizing radiation from two or more metal oxide semiconductor capacitors (MOSCAPs) having radiation-sensitive gate terminals with different radiation sensitivities dependant upon the material composition of the gate terminal and the energy of the incident radiation, to determine the energy of the incident radiation.

2. The method of claim 1, wherein the radiation sensitivity of a gate terminal is based on additional secondary electrons produced by radiation passing through the gate composition material.

3. The method of claim 1, wherein the gate terminals of at least two MOSCAPs comprise materials of different compositions having different atomic numbers.

4. The method of claim 3, wherein there are at least three MOSCAPs, of which at least one MOSCAP having a gate terminal comprising a low atomic number composition material, at least one MOSCAP having a gate terminal comprising a medium atomic number composition material, and at least one MOSCAP having a gate terminal comprising a high atomic number composition material.

5. The method of claim 4, wherein the gate terminal of at least one of the MOSCAPs comprises aluminum, wherein the gate terminal of at least one of the MOSCAPs comprises molybdenum, and wherein the gate terminal of at least one of the MOSCAPs comprises gold.

6. The method of claim 4, wherein the gate terminal of at least one of the MOSCAPs terminals comprises poly-silicon, wherein the gate terminal of at least one of the MOSCAPs comprises copper, and wherein the gate terminal of at least one of the MOSCAPs comprises tungsten.

7. The method of claim 1, wherein the plurality of radiation-induced signals comprises at least two radiation-induced signals.

8. The method of claim 1, wherein the at least two metal oxide semiconductor capacitors (MOSCAPs) comprise at least three MOSCAPs with different gate materials that give their respective MOSCAP a different radiation sensitivity.

9. An apparatus for determining the energy of incident radiation comprising:
    at least two metal oxide semiconductor capacitors (MOSCAPs) each having a gate terminal disposed over a radiation-sensitive layer, the gate terminals of at least two of the MOSCAPs being comprised of a respective different respective gate composition material, wherein each respective different gate composition material has a different respective level of radiation sensitivity which depends on the respective atomic number for the gate composition material and the energy level of an incident radiation, to provide different signals when exposed to incident radiation, so that the energy level of the radiation can be determined.

10. The apparatus of claim 9, wherein there are at least two MOSCAPs, each having a gate terminal of a different material than the gate terminals of the other MOSCAPs.

11. The apparatus of claim 10, wherein the gate terminal of one of the at least three MOSCAPs comprises a low atomic number composition material, wherein the gate terminal of one of the at least three MOSCAPs comprises a medium atomic number composition material, and wherein the gate terminal of one of the at least three MOSCAPs comprises a high atomic number composition material, respectively.

12. The apparatus of claim 11, wherein one gate terminal of the at least three MOSCAPs comprises aluminum, wherein one gate terminal of the at least three MOSCAPs comprises molybdenum, and wherein one gate terminal of the at least three MOSCAPs comprises gold.

13. The apparatus of claim 11, wherein one gate terminal of the at least three MOSCAPs comprises poly-silicon, wherein one gate terminal of the at least three MOSCAPs comprises copper, and wherein one gate terminal of the at least three MOSCAPs comprises tungsten.

14. The apparatus of claim 9, wherein the radiation sensitivity of each respective different gate composition material is based on additional secondary electrons produced by radiation passing through the gate composition material.

15. The apparatus of claim 9, wherein each of the respective different gate composition materials has a different atomic number.

16. A method of determining the energy of incident radiation, comprising:
measuring the radiation-induced signals from the gate terminals in at least three metal oxide semiconductor capacitor (MOSCAP) sensors each having a different gate composition material having a different radiation sensitivity; and determining a tissue equivalent radiation response based on the differences among the radiation induced signals from the one or more MOSCAP sensors.

17. The method of claim 16, wherein the radiation sensitivity of each respective gate terminal is based on additional secondary electrons produced by radiation passing through the respective different gate composition material of the gate terminal.

18. The method of claim 16, wherein each of the respective different gate composition materials has a different atomic number.

19. The method of claim 18, wherein at least one gate terminal of the at least three MOSCAPs comprises a low atomic number composition material, wherein at least one gate terminal of the at least three MOSCAPs comprises a medium atomic number composition material, and wherein at least one gate terminal of the at least three MOSCAPs comprises a high atomic number composition material, respectively.

20. The method of claim 19, wherein one gate terminal of the at least three MOSCAPs comprises aluminum, wherein one gate terminal of the at least three MOSCAPs comprises molybdenum, and wherein one gate terminal of the at least three MOSCAPs comprises gold.

21. The method of claim 19, wherein one gate terminal of the at least three MOSCAPs comprises poly-silicon, wherein one gate terminal of the at least three MOSCAPs comprises copper, and wherein one gate terminal of the at least three MOSCAPs comprises tungsten.

* * * * *